(12) United States Patent
Unsworth et al.

(10) Patent No.: US 6,757,665 B1
(45) Date of Patent: Jun. 29, 2004

(54) DETECTION OF PUMP CAVITATION/ BLOCKAGE AND SEAL FAILURE VIA CURRENT SIGNATURE ANALYSIS

(75) Inventors: Peter J. Unsworth, Lewes (GB); Frederick M. Discenzo, Brecksville, OH (US); Vetcha Sarat Babu, Narsapur (IN)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 09/407,617

(22) Filed: Sep. 28, 1999

(51) Int. Cl.$^7$ .............................. G06E 3/00; G06F 15/18
(52) U.S. Cl. ............................ 706/15; 706/5; 706/904; 706/905; 706/906; 706/907
(58) Field of Search .............................. 706/5, 15, 904, 706/905, 907, 906

(56) References Cited

U.S. PATENT DOCUMENTS

| | | | |
|---|---|---|---|
| 4,985,857 A | | 1/1991 | Bajpai et al. .......... 364/551.01 |
| 5,305,235 A | * | 4/1994 | Izui et al. .............. 364/551.01 |
| 5,419,197 A | * | 5/1995 | Ogi et al. ...................... 73/659 |
| 5,623,579 A | * | 4/1997 | Damiano et al. ............. 706/17 |
| 5,627,941 A | * | 5/1997 | Takahashi et al. ............ 706/25 |
| 5,772,403 A | | 6/1998 | Allison et al. ............. 417/44.2 |
| 5,846,056 A | | 12/1998 | Dhindsa et al. ............ 417/44.2 |
| 5,864,773 A | * | 1/1999 | Barna et al. ................... 702/85 |
| 5,919,267 A | * | 7/1999 | Urnes et al. ................... 714/26 |
| 6,260,004 B1 | | 7/2001 | Hays et al. ................. 702/183 |
| 6,326,758 B1 | * | 12/2001 | Discenzo .................... 318/609 |
| 6,330,525 B1 | | 12/2001 | Hays et al. ................. 702/183 |

OTHER PUBLICATIONS

Cheon et al, "Application of Neural Networks to multiple Alarm processing and Diagnosis in Nuclear Power plants", IEEE Transaction on Nuclear Science, vol. 40, No. 1, Feb. 1993.*

* cited by examiner

*Primary Examiner*—George B. Davis
(74) *Attorney, Agent, or Firm*—Amin & Turocy LLP; Alexander M. Gerasimow; R. Scott Speroff

(57) ABSTRACT

A system and method is provided for monitoring the operating condition of a pump by evaluating fault data encoded in the instantaneous current of the motor driving the pump. The data is converted to a frequency spectrum which is analyzed to create a fault signature having fault attributes relating to various fault conditions associated with the pump. The fault signature is then input to a neural network that operates in conjunction with a preprocessing and post processing module to perform decisions and output those decisions to a user interface. A stand alone module is also provided that includes an adaptive preprocessing module, a one-shot unsupervised neural network and a fuzzy based expert system to provide a decision making module that operates with limited human supervision.

41 Claims, 20 Drawing Sheets

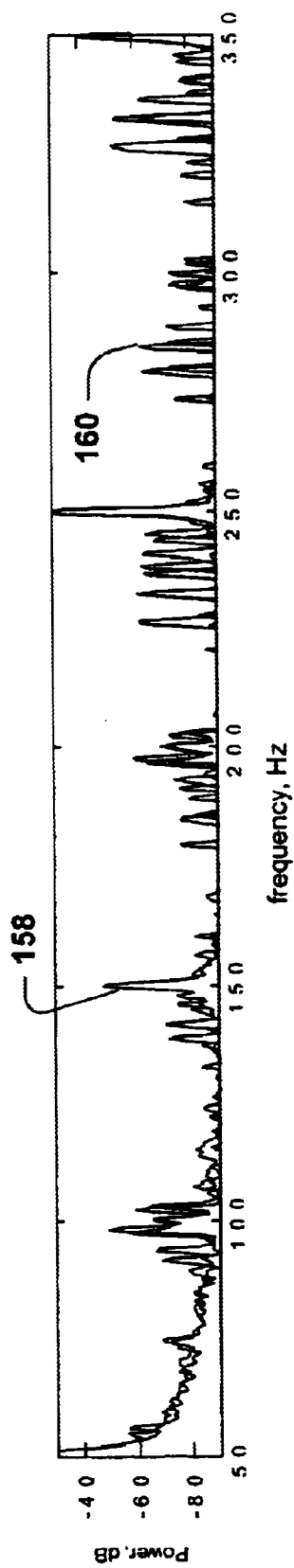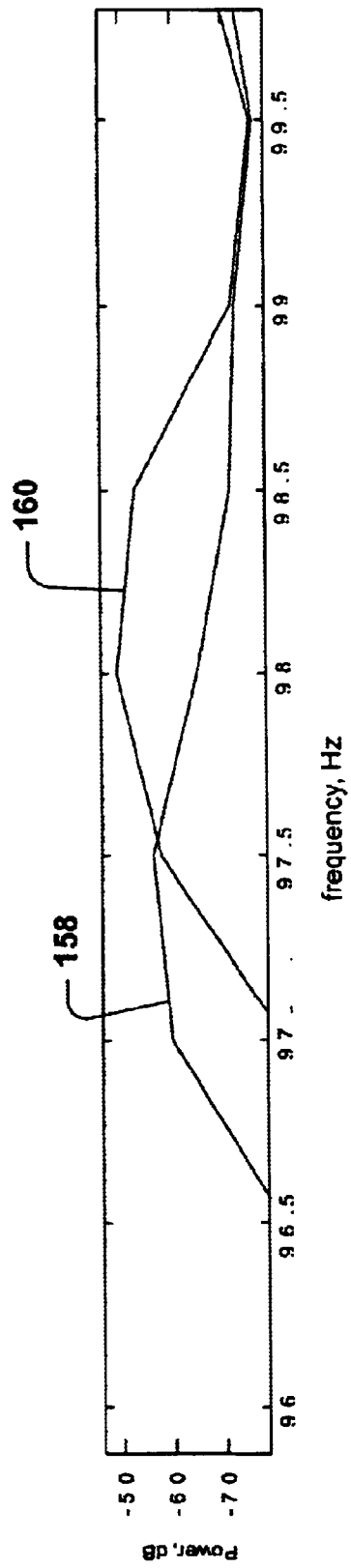
Fig. 6e
Fig. 6f

| | $f_0$ | $f_1$ | $f_2$ | $f_3$ | $f_4$ | • • • | $f_n$ | |
|---|---|---|---|---|---|---|---|---|
| | $A_3$ | $A_{34}$ | $A_{67}$ | $A_{78}$ | $A_{84}$ | • • • | $A_K$ | HEALTHY PUMP |
| | $A_{34}$ | $A_{-68}$ | $A_{-90}$ | $A_{-65}$ | $A_{45}$ | • • • | $A_H$ | PUMP FAULT 1 |
| | $A_{56}$ | $A_{45}$ | $A_{45}$ | $A_{56}$ | $A_{78}$ | • • • | $A_X$ | PUMP FAULT 2 |
| | $A_{-23}$ | $A_{45}$ | $A_7$ | $A_{90}$ | $A_{12}$ | • • • | $A_Z$ | PUMP FAULT 3 |
| | $A_{67}$ | $A_{36}$ | $A_3$ | $A_{45}$ | $A_{47}$ | • • • | $A_X$ | PUMP FAULT 4 |
| | $A_{78}$ | $A_{67}$ | $A_{12}$ | $A_{67}$ | $A_{37}$ | • • • | $A_C$ | PUMP FAULT 5 |
| | $A_{234}$ | $A_{27}$ | $A_{478}$ | $A_{24}$ | $A_{127}$ | • • • | $A_Q$ | PUMP FAULT 6 |
| | $A_{98}$ | $A_{78}$ | $A_{26}$ | $A_{12}$ | $A_{128}$ | • • • | $A_B$ | PUMP FAULT 7 |
| | $A_{26}$ | $A_{96}$ | $A_{83}$ | $A_{56}$ | $A_{234}$ | • • • | $A_M$ | PUMP FAULT 8 |
| | $A_4$ | $A_{32}$ | $A_{187}$ | $A_{56}$ | $A_{34}$ | • • • | $A_1$ | PUMP FAULT 9 |
| | $A_0$ | $A_{18}$ | $A_{73}$ | $A_{78}$ | $A_{33}$ | • • • | $A_E$ | PUMP FAULT N-1 |
| | $A_{75}$ | $A_{17}$ | $A_{45}$ | $A_{69}$ | $A_{44}$ | • • • | $A_O$ | PUMP FAULT N |

Fig. 6g

IF all the attributes are *NORMAL* THEN condition is normal
IF slip is *SLLO* and noise_2 is *HI* THEN condition is low-cav
IF noise_4 and noise_5 are *VERHI* THEN condition is sev-cav
IF noise_4 and noise_5 are *HI* THEN condition is sev-cav
IF FsAmp is *SLLO* and noise_5 are *SLHI* THEN condition is sev-cav
IF FsAmp is *LO* and noise_5 is *SLHI* THEN condition is sev-cav
IF FsAmp is *VERLO* and noise_5 is *SLHI* THEN condition is sev-cav
IF FsAmp is *SLLO* and noise_4 are *HI* THEN condition is sev-cav
IF FsAmp is *LO* and noise_4 is *HI* THEN condition is sev-cav
IF FsAmp is *LO* and noise_4 is *VERHI* THEN condition is sev-cav
IF FsAmp is *SLLO* and slip is *SLLO* and noise_4 is *NORMAL* and noise_5 is *NORMAL* THEN condition is low-block
IF FsAmp is *LO* and noise_4 is *NORMAL* and noise_5 is *NORMAL* THEN condition is sev-block
IF slip and FsAmp are *VERLO* THEN condition is sev-block
IF FrAmp is *HI* THEN condition is impel-fault
IF framp is *VERHI* THEN condition is impel-fault

Fig. 15

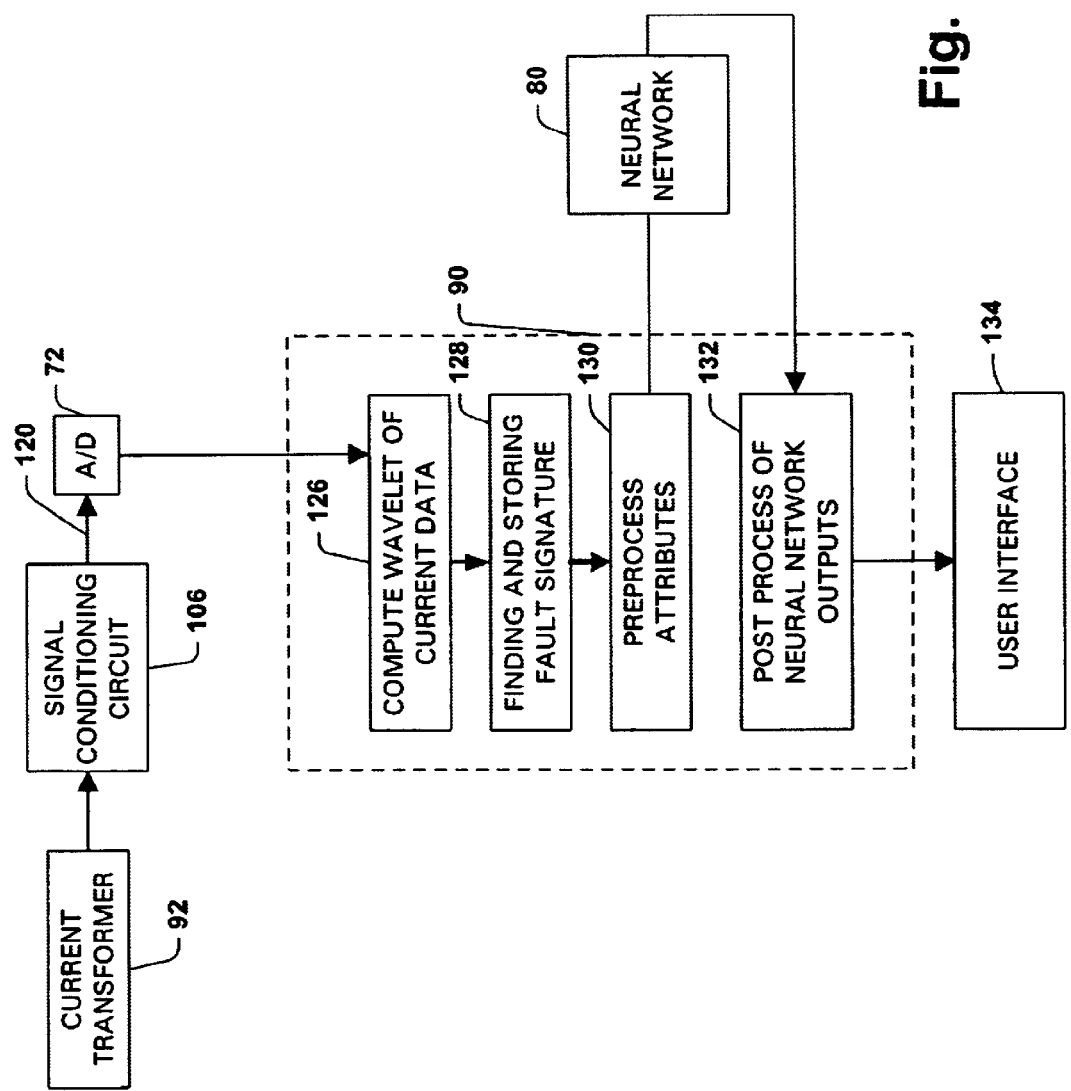

DETECTION OF PUMP CAVITATION/BLOCKAGE AND SEAL FAILURE VIA CURRENT SIGNATURE ANALYSIS

TECHNICAL FIELD

The present invention generally relates to a system and method for obtaining and using synthesized fault data for pump diagnosis and failure prediction.

BACKGROUND OF THE INVENTION

Motors, pumps and bearings require frequent maintenance attention in typical commercial systems and industrial plants. With conventional maintenance strategies such as exception-based and periodic-checking, faults developed in critical equipment (e.g. pumps) have to be detected by human experts through physical examination and other off-line tests (e.g., metal wear analysis) during a routine maintenance in order for corrective action to be taken. Faults that go undetected during a regular maintenance check-up may lead to catastrophic failure and un-scheduled shut-down of the plant. The probability of an un-scheduled shut-down increases as the time period between successive maintenance inspections increases. The frequency of performing maintenance, however, is limited by availability of manpower and financial resources and hence is not easily increased. Some maintenance inspections, such as impeller inspection may require stopping the process or even disassembling machinery. The lost production time may cost ten times more than the labor cost involved. There is also a possibility that the reassembled machine may fail due to an assembly error or high start up stresses for example. Finally, periodically replacing components (via routine preventive maintenance) such as bearings, seals, or impellers is costly since the service life of good components may unnecessarily be cut short.

Cavitation, blockage and impeller damage are common problems/faults encountered with pumps. Cavitation can cause accelerated wear, and mechanical damage to pump components, couplings, gear trains, and drive motors. Cavitation is the formation of vapor bubbles in the inlet flow regime or the suction zone of the pump. This condition occurs when local pressure drops to below the vapor pressure of the liquid being pumped. These vapor bubbles collapse or implode when they enter a high pressure zone (e.g. at the discharge section or a higher pressure area near the impeller) of the pump causing erosion of impeller casings as well as other pump components. If a pump runs for an extended period under cavitation conditions, permanent damage may occur to the pump structure and accelerated wear and deterioration of pump internal surfaces and seals may occur. Detection of such conditions before they become severe or prolonged can help to avoid cavitation-induced damage to the pump and facilitate extended plant up time. Such detection also can avoid accelerated pump wear and unexpected failures and further enable a well planned and cost-effective maintenance routine. Depending on the type of pump, other problems can occur such as inlet or outlet blockage, leakage of air into the system due to faulty pump seals, or the impeller or impeller parts impacting the pump casing.

Prior efforts in pump diagnostics have included vibration analysis and acoustic analysis techniques. For example, a modern chemical plant may require a service engineer to physically go to hundreds or even thousands of critical pumps periodically (e.g., monthly) to record vibration data from the pump. The data is then subsequently analyzed using vibration analysis algorithms to detect pump problems such as broken impeller vanes or out of balance conditions. Other research efforts have looked at performing pump diagnostics using process instrumentation such as flow meters and pressure transducers. Some efforts have looked at the relationship between inlet and outlet pressures and flow rate with pump speed to determine if a pump problem exists. Others have performed trending on these parameters over time.

Still other techniques have focused on signal analysis of unconditioned process sensors, such as flow sensors and pressure sensors. Flow sensors such as orifice-plate differential pressure, vortex, turbine, time-domain pressure techniques are invasive sensors and must be installed in-line within the process framework or pump system. Other flow sensors such as corriolis flow meters, are extremely costly and must be installed in-line with process piping.

In view of the above, there is a strong need in the art for a system and/or method for condition monitoring which mitigates some of the above-noted problems associated with conventional pump monitoring systems and/or methods.

SUMMARY OF THE INVENTION

The present invention provides for a system and method for condition monitoring of synthesized fault data and determining an operating condition of a pump. It has been found that fault data relating to the operating condition of a pump is encoded in variations in current of a motor driving the pump. These features present in the stator frequency spectrum of the motor stator current are caused by load effects of the pump on the motor rather than changes in the motor itself. The present invention provides a system and method for extracting (e.g., synthesizing) the fault data directly from the instantaneous motor current data. This data relates not only to pump machinery conditions, but also pump process conditions. Thus, by employing current signature analysis of the instantaneous current of the motor driving the pump, problems with the pump and/or process line can be detected without using invasive and expensive pressure and flow meters. Instead, a lower cost current sensor may be used and this sensor may be located in a motor control center or other suitable location remote from the motor and pump.

More particularly, in a preferred embodiment, the present invention includes utilizing an artificial neural network (ANN) to analyze the current signature data of the motor that relates to pump faults. Although, multi-iterative, supervised leaning algorithms could be used, which could be trained and used only when a fully-labeled data set corresponding to all possible operating conditions, the application of unsupervised ANN techniques that can learn on-line (even in a single iteration) are preferred. The present invention will be described with respect to an AC induction motor and both centrifugal and positive displacement pumps. However, it is to be appreciated that the present invention has applicability to substantially any type of pump and motor combination where current signature analysis can be performed to determine the operating state (e.g., health) of the pump. It should also be appreciated that the current signature analysis can be performed both on the pump to determine the operating state of the pump, and on the motor driving the pump to determine the operating state of the motor, simultaneously.

The present invention also provides for preprocessing of the fault signature data before it is being used to train an ANN or design a decision module based on ANN paradigms.

The preprocessing eliminates outliers and performs scaling and bifurcation of the data into training and testing sets. Furthermore, it is desired to further post process the output generated by unsupervised ANN based decision modules for condition monitoring applications. This is because unsupervised ANN based decision modules when presented with a new operating condition can only signal the formation of a new output entry indicating that a possible new condition has occurred, but is not necessarily able to provide particular fault information. Post processing is carried out by utilizing the domain knowledge of a human expert to develop an expert system, or by correctly classifying this new operating state and encoding this information in a fuzzy expert system for future reference.

Furthermore, the present invention provides an intelligent, stand alone decision module which can identify the operating condition of the pump/plant without significant human supervision. The stand alone decision module employs adaptive preprocessing and intelligent post processing in conjunction with a one shot unsupervised ANN algorithm. Preferably, the ANN algorithm is either an adaptive resonance theory (ART-2) or associative list memory (ALM) algorithm. Typical operating characteristics related to the motor, pump and fault signatures is used to define the default limits to be used in the adaptive preprocessing and for designing a Fuzzy Rule Based Expert System (FRBES) for post processing in the condition monitoring of the pump.

It should be appreciated that the present invention can be utilized to analyze both the motor and the pump from a motor-pump system and identify fault modes. It should be further appreciated that the present invention can be employed to condition monitor multiple pumps and motors simultaneously.

In accordance with one particular aspect of the present invention, a system for monitoring the condition of a pump driven by a motor is provided. A sensor is operatively coupled to a power lead of the motor, the sensor is adapted to obtain at least one current signal relating to the operation of the pump. An artificial neural network is operatively coupled to the sensor, the artificial neural network being adapted to detect at least one fault relating to the operation of the pump from the at least one current signal.

Another aspect of the present invention relates to a method for monitoring the condition of a pump driven by a motor. A first sample of current data signal relating to the operation of the pump is collected. The first sample of current data signal is input to a neural network. A second sample of current data signal relating to the operation of the pump is collected. The second sample of current data signal is input to the neural network, wherein any differences between the first signal and the second signal will be generated as a change in condition signal by the neural network, any change of condition.

Still yet another aspect of the present invention relates to a stand alone decision module adapted to receive a current signal from a machine and facilitate diagnosing the state of the machine by determining if the current signal contains fault data relating to the state of the machine. A neural network is operatively coupled to a sensor, the neural network is adapted to synthesize a change in condition signal from the sampled current data. A preprocessing portion is operatively coupled to the neural network, the preprocessing portion is adapted to condition the current signal prior to inputting the current signal into the neural network. A post processing portion is operatively coupled to the neural network, the post processing portion is adapted to determine whether the change in condition signal is due to a fault condition related to the state of the machine.

Another aspect of the present invention relates to a system for simultaneously monitoring the condition of a pump driven by a motor and the condition of the motor driving the pump. A sensor is operatively coupled to a power source of the motor, the sensor is adapted to obtain at least one current signal relating to the operation of the pump and the operation of the motor. An artificial neural network is operatively coupled to the sensor, the artificial neural network being adapted to detect at least one fault relating to the operation of the pump and at least one fault relating to the operation of the motor from the at least one current signal.

Another aspect of the present invention relates to a system for diagnosing a plurality of pumps, each driven by a motor. A plurality of sensors obtain current data signals from each motor. A channel interface is operatively coupled to the plurality of sensors, the channel interface designating a separate channel for each of the plurality of sensors. A host computer is operatively coupled to the channel interface, the host computer including a neural network operatively coupled to each channel of the channel interface, the neural network adapted to detect at least one fault relating to the operation of the plurality of pumps from the current data signals, wherein a processor of the host computer cycles through each of the channels, the processor performing classical signature analysis on each of the plurality of pumps using the current data signal for each respective pump.

Another aspect of the present invention relates to a system for monitoring the condition of a pump driven by a motor, including means for detecting at least one current signal from the motor, said at least one current signal containing fault attributes related to the condition of the pump; means for extracting the fault attributes from the at least one current signal; means for determining if the fault attributes signify a fault condition of the pump; and means for communicating any fault conditions to a system operator.

Another aspect of the present invention relates to a system for monitoring the condition of a pump driven by a motor. A sensor is operatively coupled to a power lead of the motor, the sensor is adapted to obtain at least one current signal relating to the operation of the pump. A processor is operatively coupled to the sensor, the processor is adapted to convert the at least one current signal to a frequency spectrum having a plurality of fault attributes related to the condition of the pump and preprocess the fault attributes. An unsupervised artificial neural network is operatively coupled to the processor, the artificial neural network being adapted to recognize and detect changes in the plurality of preprocessed fault attributes and provide a change of condition pattern relating to changes in the plurality of preprocessed fault attributes. A post processor includes decision making rules for determining fault conditions of the pump based on the change of condition pattern, the post processor communicating any fault conditions to a system operator.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 6e is a graph of a comparison of a Fast Fourier Transform signal representative of normal condition of a centrifugal pump and a faulty impeller condition of the same pump in accordance with the present invention;

FIG. 6f is a magnified window of the graph of FIG. 6e in accordance with the present invention;

FIG. 6g is a table diagram of current signal amplitudes over a range of frequencies, which may be employed to facilitate diagnosing an operating state of a machine in accordance with the present invention;

FIG. 15 is an example of a set of fuzzy rules in accordance with the present invention;

FIG. 17 is a function block diagram illustrating the monitoring system of FIG. 4a utilizing wavelets in accordance with the present invention.

DETAILED DESCRIPTION OF THE INVENTION

Figure 1A:
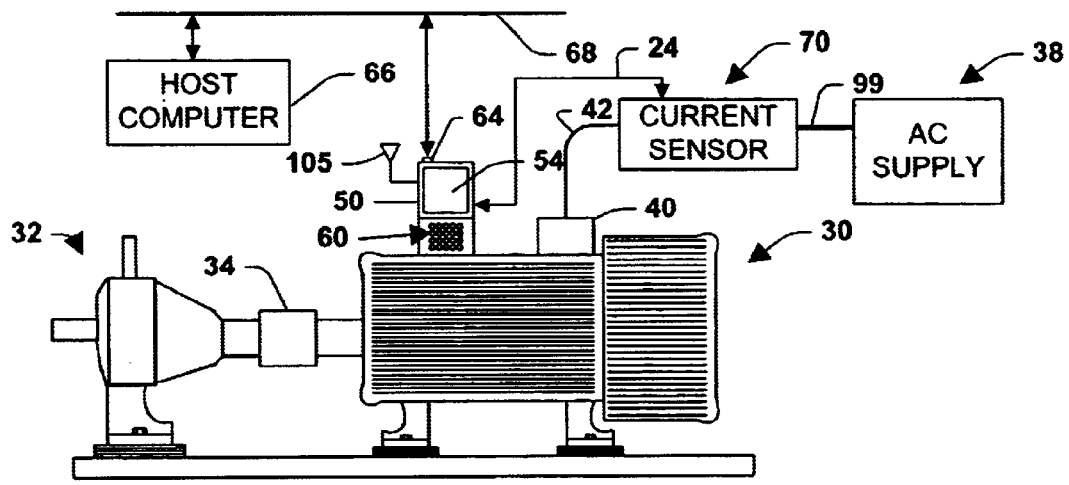
FIG. 1a is a side view of an integrated pump, AC induction motor and diagnostic apparatus in accordance with one particular aspect of the present invention.

The present invention will now be described with reference to the drawings, wherein like reference numerals are used to refer to like elements throughout.

As is mentioned above, the present invention relates to a system and method for using synthesized fault data encoded in the instantaneous current of a motor driving a pump for pump diagnosis and failure prediction. One particular aspect of the present invention employs a neural network to monitor the synthesized fault data in order to diagnose the operating condition of the pump. As previously mentioned, it is to be appreciated that the present invention can be applied to monitoring both the pump and the motor driving the pump simultaneously.

Figure 2:
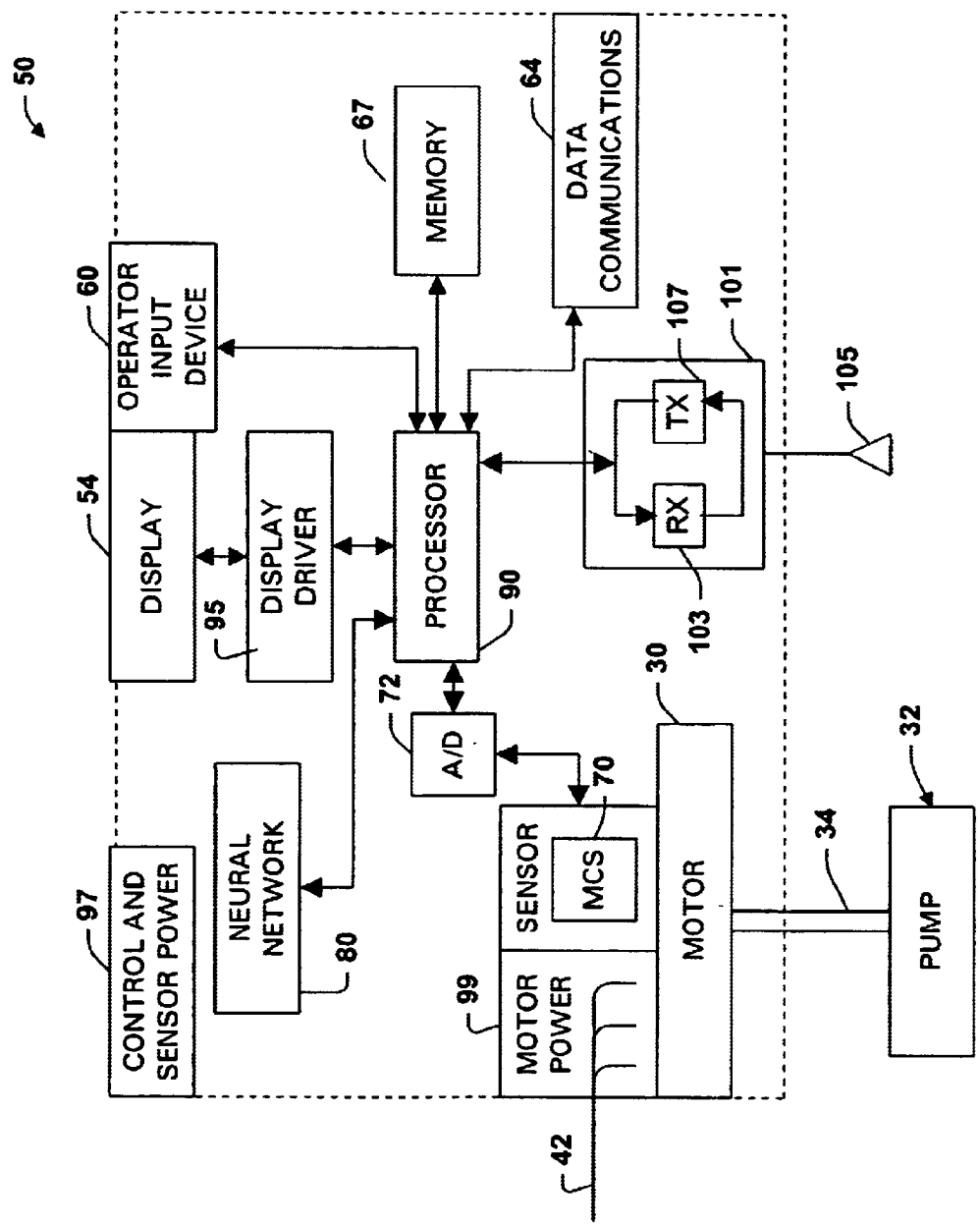
FIG. 2 is a functional-schematic diagram of an integrated pump, AC induction motor and diagnostic apparatus in accordance with the present invention.

Referring initially to FIGS. 1a and 2, one specific environment in which the present invention may be employed is shown. A three-phase AC induction motor 30 is depicted driving a pump 32 through a shaft coupling 34. Alternatively, a single shaft without a coupling could be provided connecting the pump 32 to the motor 30. The motor 30 includes a junction box 40 for receiving conductors from power lines via a conduit 42, which are tied to power supply lines 99 of the motor 30. The motor 30 is preferably AC powered and operates at an AC power line frequency of 60 Hz. However, it is appreciated that in other countries different line frequencies (e.g., 50 Hz) may be employed. It should also be appreciated that the pump 32 and motor 30 could be replaced with an inverter fed motor-pump system.

Coupled to the motor 30 is a diagnostic device 50. Coupled to the diagnostic device 50 via a sensor signal line 24 is a current sensor 70 attached to the power lines 99. The diagnostic device 50 includes a display 54 for displaying to an operator information relating to the operation of the pump 32. The diagnostic device 50 further includes an operator input device 60 in the form of a key pad which enables a user to enter data, information, function commands, etc. For example, the user may input information relating to motor status via the keypad 60 for subsequent transmission to a host computer 66. In addition, the keypad 60 may include up and down cursor keys for controlling a cursor which may be shown on the display 54. Alternatively, the diagnostic device 50 could include a tri-state LED without the display 54 or the keypad 60. Furthermore, the diagnostic device 50 and the current sensor 70 could be integrated into the motor 30. The diagnostic device 50 includes a communications port 64 for interfacing the diagnostic device 50 with the host computer 66 via a conventional communications link. According to a preferred aspect of the present invention, the diagnostic device 50 is part of a communication system including a network backbone 68. The network backbone 68 may be a hardwired data communication path made of twisted pair cable, shielded coaxial cable or fiber optic cable, for example, or may be wireless or partially wireless in nature. Information is transmitted via the network backbone 68 between the diagnostic device 50 and the host computer 66 which are coupled to the network backbone 68. The communication link preferably adheres to the RS232C standard for communicating command and parameter information. However, any communication link or network link such as DeviceNet suitable for carrying out the present invention may be employed.

Referring now to FIG. 2, a schematic representation of the present invention is shown according to one particular aspect of the present invention, wherein the diagnostic device 50 is integrated with the three phase induction motor 30 driving the pump 32. However, it will be appreciated from the discussion herein that the diagnostic apparatus 50 may be located remotely from the motor 30. Furthermore, it will be appreciated that the host computer 66 itself may be employed to carry out the herein described functions of the diagnostic device 50. The induction motor 30 includes the pump 32 at the front end thereof. The output shaft coupling 34 connects the pump 32 to the motor 30.

A processor 90 is responsible for controlling the general operation of the diagnostic apparatus 50. The processor 90 is programmed to control and operate the various components within the diagnostic apparatus 50 in order to carry out the various functions described herein. The processor or CPU 90 can be any of a plurality of processors, such as the p24T, Pentium 50/75, Pentium 60/90, and Pentium 66/100, Pentium PRO and Pentium 2, and other similar and compatible processors or micro controllers. The manner in which the processor 90 can be programmed to carry out the functions relating to the present invention will be readily apparent to those having ordinary skill in the art based on the description provided herein.

A memory 67 tied to the processor 90 is also included in the diagnostic apparatus 50 and serves to store program code executed by the processor 90 for carrying out operating functions of the diagnostic apparatus 50 as described herein. The memory 67 also serves as a storage medium for temporarily storing information such as historical signature fault data and the like. The memory 67 is adapted to store a complete set of the information to be displayed. According to a preferred embodiment, the memory 67 has sufficient capacity to store multiple sets of information, and the processor 90 could include a program for alternating or cycling between various sets of display information. This feature enables the display 54 to show a variety of effects conducive for quickly conveying pump operating condition information to a user.

The memory 67 includes read only memory (ROM) and random access memory (RAM). The ROM contains among other code the Basic Input-Output System (BIOS) which controls the basic hardware operations of the diagnostic apparatus 50. The RAM is the main memory into which the application programs are loaded and sampled data is stored.

The display 54 is coupled to the processor 90 via a display driver system 95. The display 54 may be a liquid crystal display (LCD) or the like. In the preferred embodiment, the display 54 is a fine pitch liquid crystal display operated as a standard CGA display with a resolution of 640×200 pixels. The display 54 functions to display data or other information relating to ordinary operation of the pump 32. For example, the display 54 may display a set of discrete pump condition indicia such as, for example, fault indicia, caution indicia, and normal operation indicia which is displayed to the operator and may be transmitted over a system backbone (not shown). Additionally, the display 54 may display a variety of functions that control the execution of the diagnostic module 50. The display 54 is capable of displaying both alphanumeric and graphical characters.

Power is provided to the processor 90 and other components forming the diagnostic apparatus 50 from a control and sensor power unit 97. However, it will be appreciated that such power could be obtained from the motor power leads 99 themselves via power converting circuitry or from network power (e.g., DeviceNet) (not shown).

The diagnostic apparatus 50 includes a communication subsystem 64 which includes a data communication port, which is employed to interface the processor 90 with the host computer 66 via the network 68. The diagnostic apparatus also optionally includes an RF section 101 connected to the processor 90. The RF section 101 includes an RF receiver 103 which receives RF transmissions from the host computer 66 for example via an antenna 105 and demodulates the signal to obtain digital information modulated therein. The RF section 101 also includes an RF transmitter 107 for transmitting information to the network backbone 68 or host computer 66, for example, in response to an operator input at input device 60 or the identification of a pump fault.

In accordance with a preferred aspect of the present invention, an AC power supply 38 (FIG. 1a) drives the motor 30. At least one sensor 70 is operatively coupled to one of the AC power lines 99 (shown as motor power) connecting the induction motor 30 to a source of power. The sensor 70 is tied to an analog to digital (AID) converter 72, which converts the analog signals provided by the sensor 70 to digital form. The analog to digital converter 72 provides the processor 90 with digitally converted signals corresponding to the analog signals provided by the sensor 70.

Figure 1B:
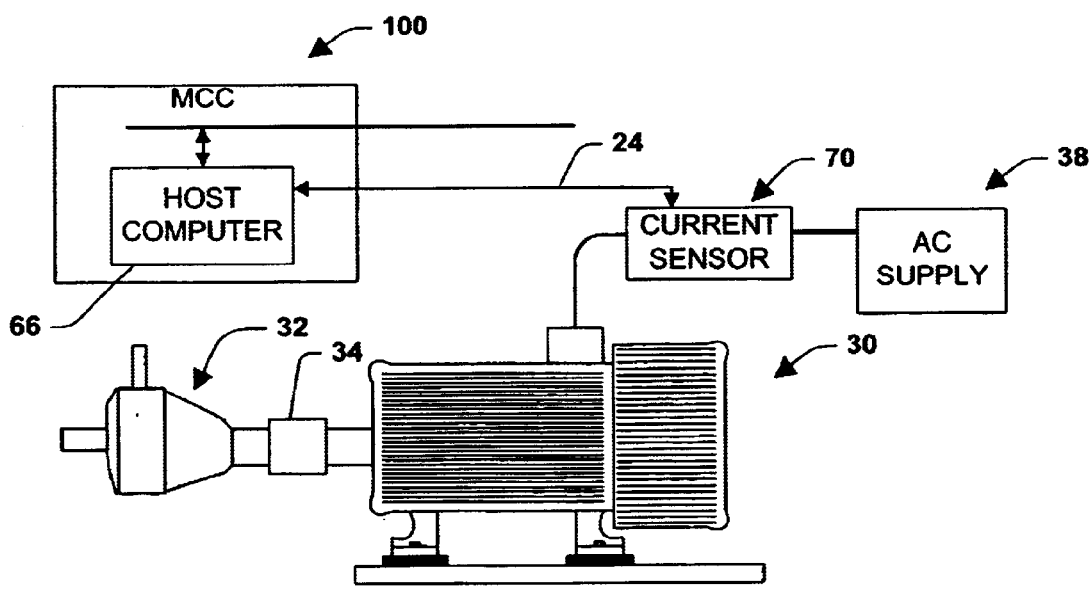
FIG. 1b is a side view of an integrated pump, AC induction motor and host computer operating as a diagnostic apparatus with the host computer located in a motor control center (MCC) in accordance with the present invention.
Figure 1C:
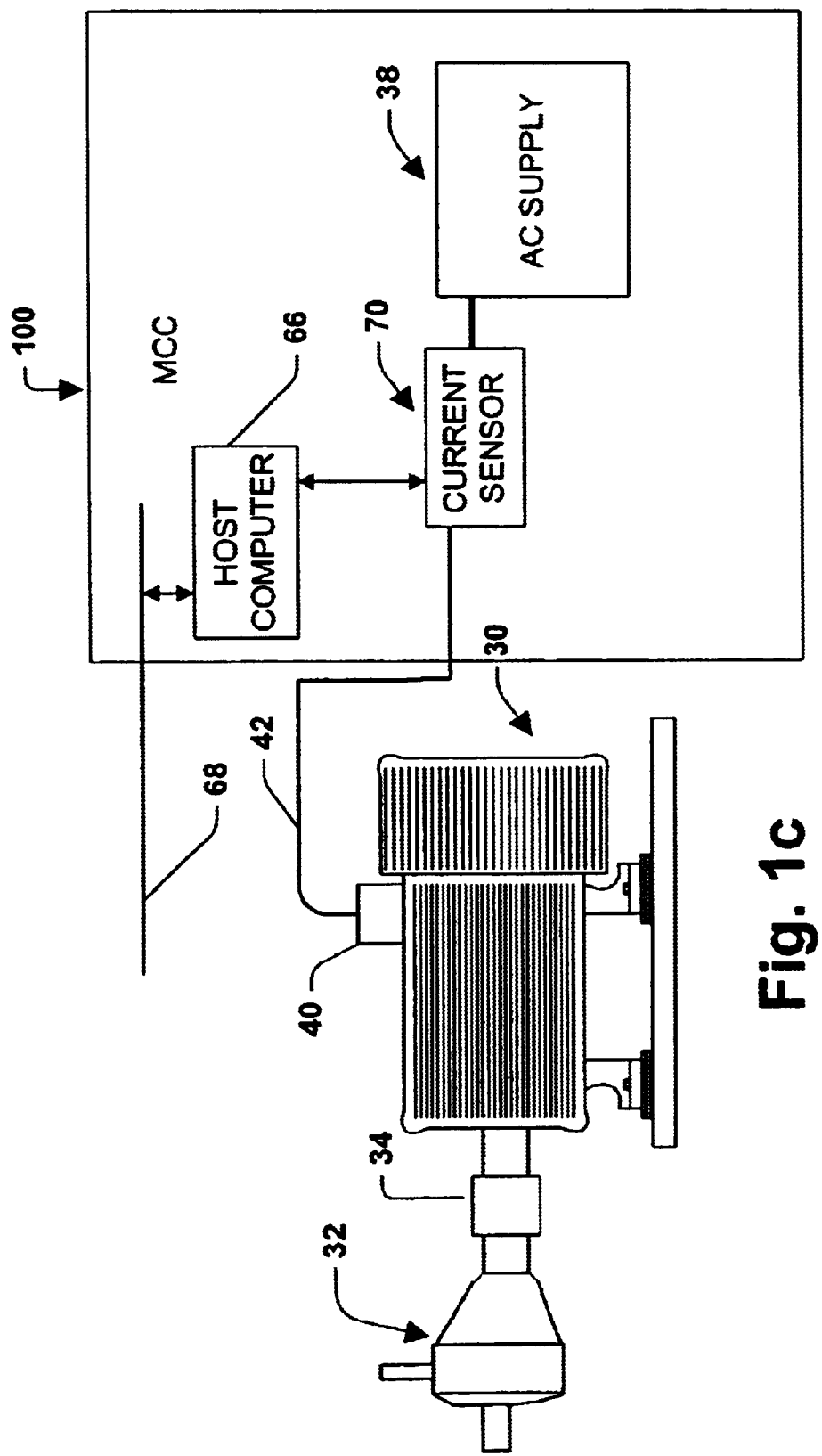
FIG. 1c is a side view of an integrated pump, AC induction motor and host computer operating as a diagnostic apparatus with the host computer, power source and current sensor located in the motor control room in accordance with the present invention.

Typically the source of power is a motor control center 100 (FIGS. 1b and 1c). Motor control centers are often used with industrial electric motors to start, control and protect the electric motor and associated electric circuitry. The motor control center typically contains motor starters to start and stop the motor along with circuit breakers to protect the electric motor and electric wiring. Preferably, the motor current sensor 70 is arranged as a current transformer on one of the power lines 99 to generate a signal corresponding to the current flowing through the respective power lead wire. Alternatively, it will be appreciated that motor current may be monitored by a separate split core current transformer clipped on a phase line at any point in the feed circuit for the motor 30. Such devices are similarly clamped about a single lead wire to the motor 30 without requiring removal of insulation or breaking wire. Installation direction or location does not affect either precision or accuracy. In other words, the motor current signal may be sensed substantially anywhere along the wire 99 running from the motor 30 back to the switch which directs the current from a common main to the wires carrying it to the motor 30.

One preferred location is at the motor control center 100 since this is located typically in a more work friendly, controlled environment (e.g., less electrical noise, HVAC controlled environment, and easier physical access) than the environment in which the motor 30 is located. It can be seen from FIG. 1b that the current sensor 70 and the power supply 38 could be located on the factory floor, while current signal line 42 is routed back to the motor control room 100, where it is coupled to the host computer 66. Distance limitations, line-noise, and wiring costs may limit the usefulness of this configuration. Preferably, the power supply 38, the current sensor 70 and the host computer 66 are located in the motor control room 100 as shown in FIG. 1c. This provides for a cleaner and less noisy environment for performing diagnostics on the pump 32. Another preferred configuration is to locate the sensor 70 and computer within the motor. Pump health may be indicated only locally (light pole, LED, or annunciator) or transmitted to a host computer or control computer (to protect equipment and process) either with wireline or wireless data links.

Figure 3:
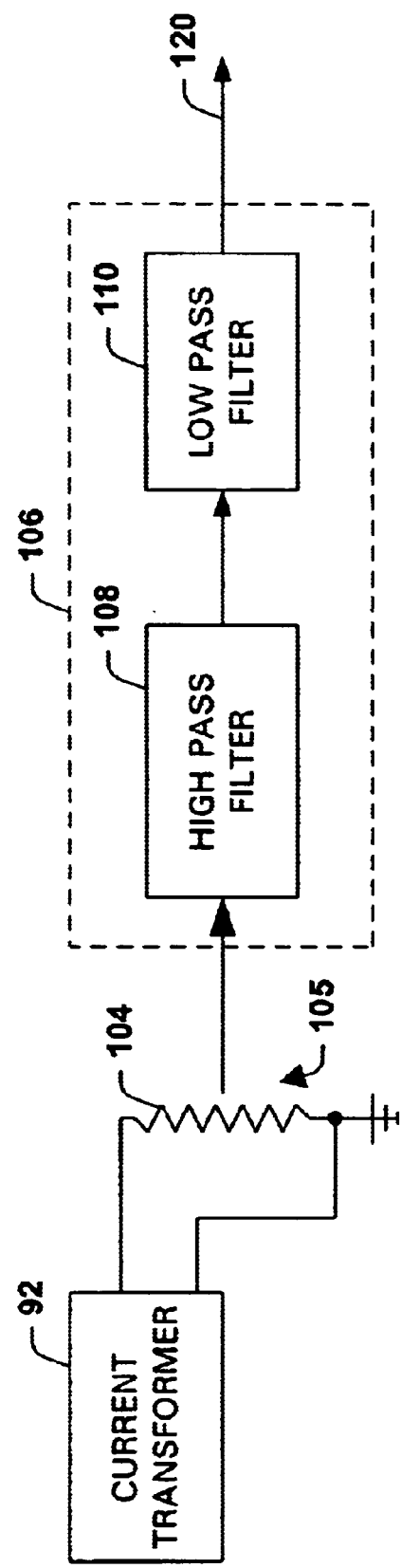
FIG. 3 is a block diagram of a current transformer and signal conditioning circuit in accordance with the present invention.

Turning briefly to FIG. 3, the output of a current transformer 92 (e.g., the output of the current transformer secondary) is a variable current signal proportional to the time-varying current flowing in the lead wire 99, and is applied across a load resistor 104 to generate a varying voltage across the resistor 104 which is proportional to the motor current. The resistor 104 may be in the form of a potentiometer having one end grounded. The variable contact 105 of the resistor 104 is connected to the input of a signal conditioning circuit 106. The resistor 104 is adjusted to provide a selected proportional relationship between the motor current and the corresponding AC voltage signal applied to the signal conditioning circuit 106. The signal conditioning circuit 106 includes a high pass filter 108 with a cut-off frequency of 1.5 Hz. The signal is then fed through a low pass filter 110 having an upper frequency cutoff below 600 Hz and a gain of four.

Figure 4A:
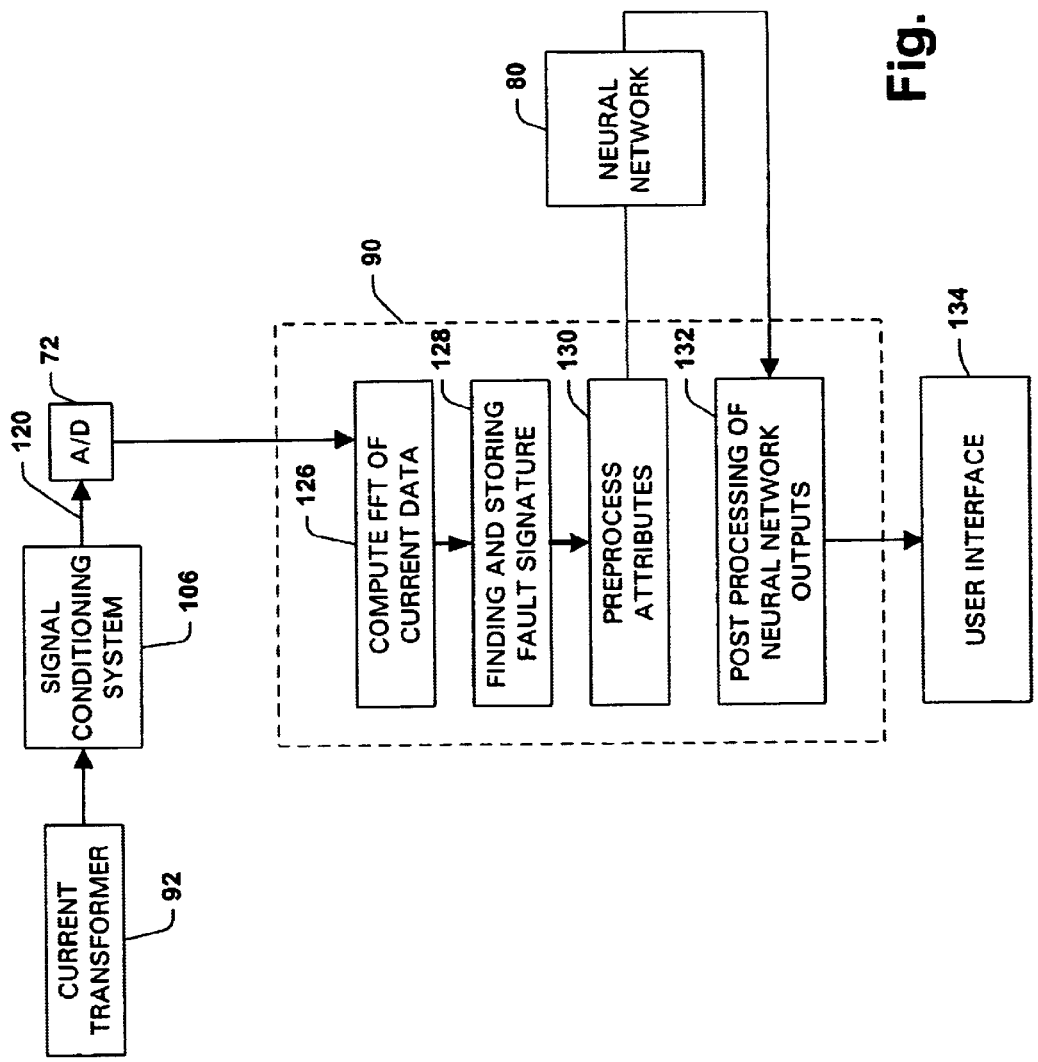
FIG. 4a is a function block diagram illustrating the monitoring system in accordance with the present invention.

As will be discussed in greater detail below, the conditioned signal 120 is eventually fed to the processor 90 in the herein described manner. FIG. 4a shows the functional steps that the current data from the motor 30 driving the pump 32 is subjected to for pump condition monitoring system. After the current data from current transformer 92 is conditioned by signal conditioning circuit 106, it is converted from analog data to digital data by the A/D converter 72, so that it can be further processed by processor 90. Processor 90 first performs the steps of computing Fast Fourier Transforms 126 of the current data. The processor 90 controls the signal sampling and digitizing rate as well as any buffering of the digitized signals that might be needed. This data collection rate should be selected to provide sufficient data upon which the processor 90 can generate a comprehensive frequency spectrum of the motor current signal suitable for analysis using commercially available Fast Fourier Transform software, such as for example MATLAB by The Math Works.

Figure 5:
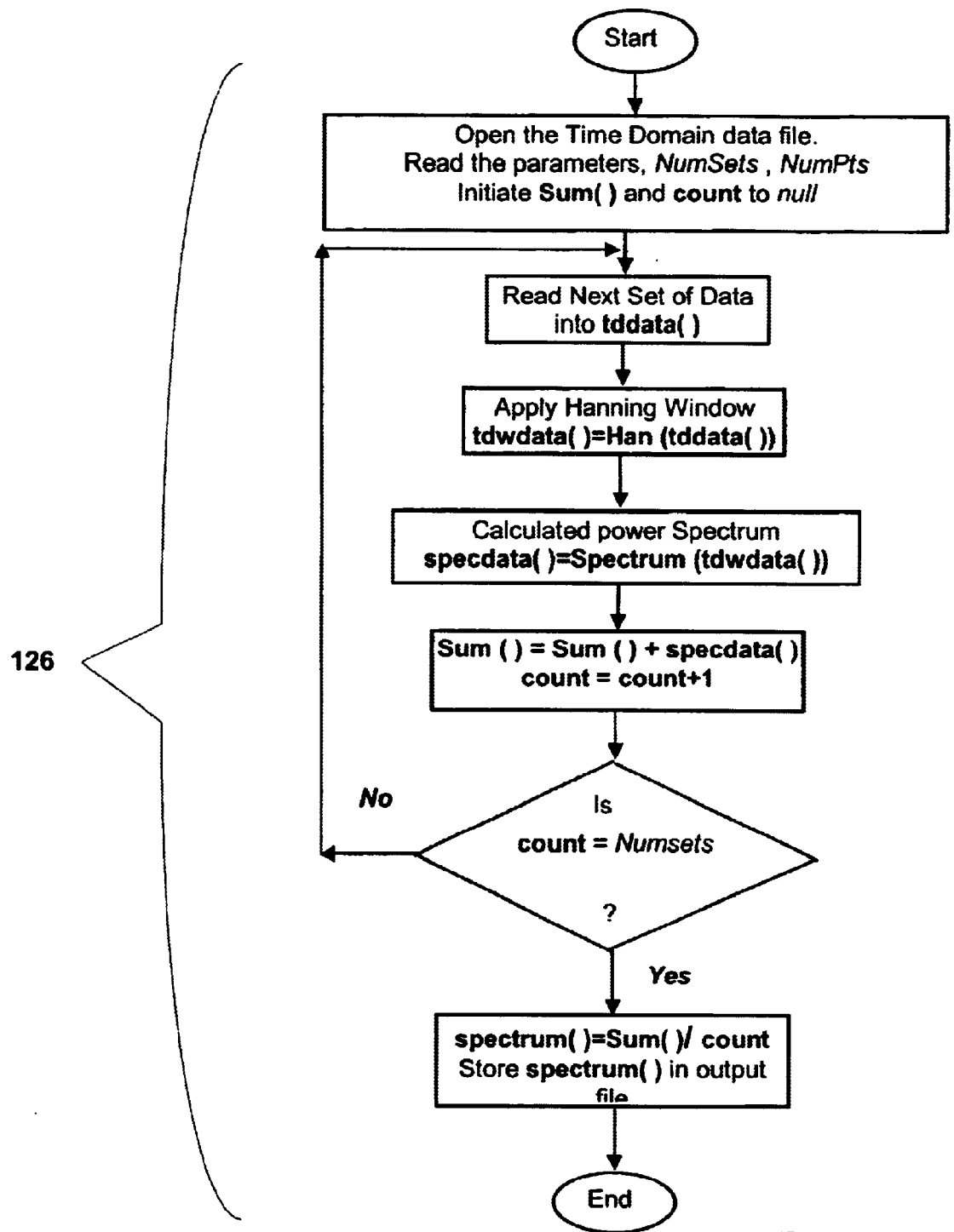
FIG. 5 is a flow diagram for performing a Fast Fourier Transformation on a conditioned signal received from the AC induction motor of FIGS. 1a–1c in accordance with the present invention.

The spectral analysis basically involves the application of a 'Hanning Window' to the time-domain data, calculation of power spectrum from each set of the windowed time-domain data for the specified number of sets, and then finding the average spectrum using the Welch method. A flow chart of the general scheme is shown in FIG. 5. The output spectra corresponding to the A/D current signal, is stored into a designated output file for future use. The parameters for the A/D data acquisition, such as the number of sets (NumSets), number of samples per set (NumPts) and the sampling rate are selected to be 8, 8192 and 4096 Samples/sec respectively for most of the experiments. These parameters yield a frequency resolution of 0.5 Hz and a bandwidth of 0 to 2048 Hz in the frequency spectra. The time-domain data consists of a contiguous record of 65536 data values collected over 16 seconds, which is then divided into eight equal sets. The noise smoothing is of a satisfactory level after the averaging of eight consecutive spectra. A Hanning window has been selected for the windowing purpose because of its ability to reduce the leakage effect to a minimum.

Figure 6A:
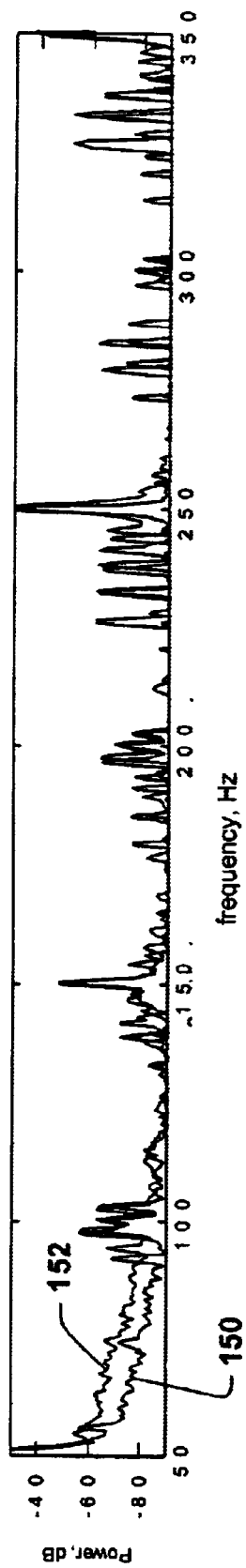
FIG. 6a is a graph of a comparison of a Fast Fourier Transform signal representative of a normal condition of a centrifugal pump and a cavitation condition of the same pump in accordance with the present invention.
Figure 6B:
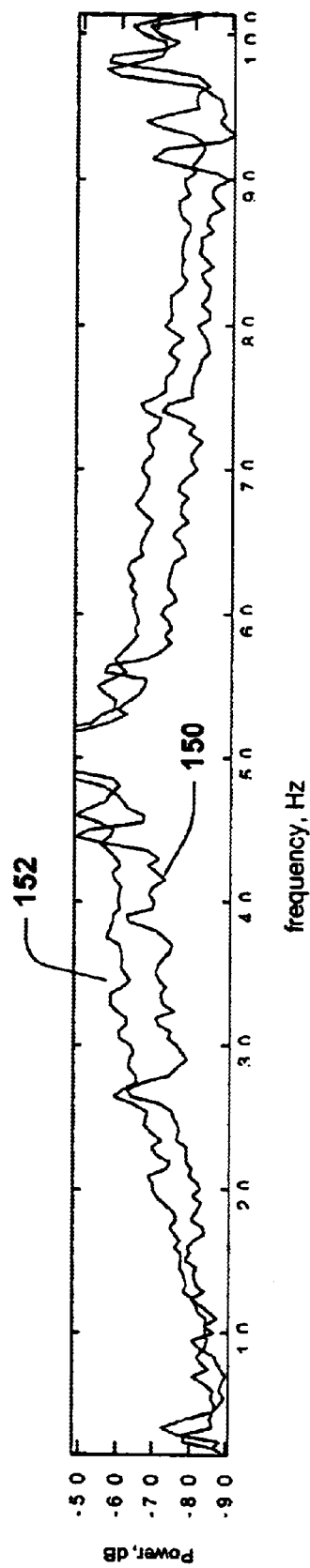
FIG. 6b is a magnified window of the graph of FIG. 6a in accordance with the present invention.
Figure 6C:
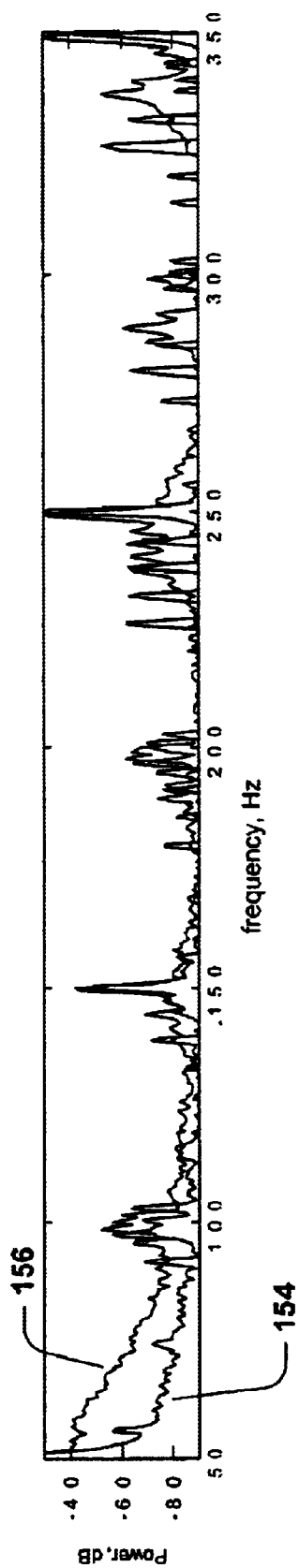
FIG. 6c is a graph of a comparison of a Fast Fourier Transform signal representative of a normal condition of a centrifugal pump and a leakage condition of the same pump in accordance with the present invention.
Figure 6D:
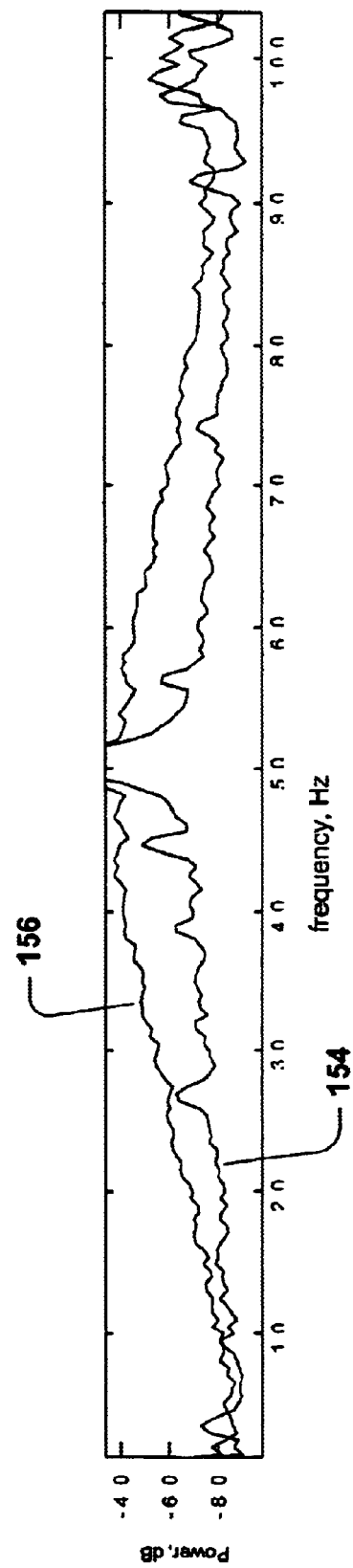
FIG. 6d is a magnified window of the graph of FIG. 6c in accordance with the present invention.

The processor 90 then finds and stores fault signatures relating to the operation of the pump in step 128. FIGS. 6a–6f show how pump faults can be detected comparing frequency spectrums of current motor data relating to normal and fault conditions. FIGS. 6a–6b show both a frequency spectrum of a centrifugal pump in a normal condition 150 and a cavitation condition 152. FIG. 6b illustrates a blown up version of FIG. 6a along a limited frequency range. It can be seen that a difference in the spectrums can be seen during cavitation. Furthermore, FIGS. 6c and 6d show both a frequency spectrum of a centrifugal pump in a normal condition 154 and a leakage condition 156, while FIGS. 6e and 6f illustrate both a frequency spectrum of a centrifugal pump in a normal condition 158 and a faulty impeller condition 160. It should be appreciated that other fault conditions such as blockage will also lead to different frequency spectrum characteristics of the current data of the motor driving the pump. Furthermore, different types of pumps will exhibit different types of faults with associated different spectrum characteristics. For example, pump faults could include cavitation, blockage, two-phase flow, impeller wear, impeller damage, the impeller impacting with the casing, a pump out of balance, corrosion, surge/hammer or other types of faults.

In one aspect of the invention, the processor 90 could access a table as the one shown in FIG. 6g. The table 200 is shown which the processor 90 accesses when performing the classical signature analysis to diagnose the health of the pump 32. The table 200 includes current amplitude data ($A_0$ thru $A_Z$) over a range of frequencies ($f_0$ thru $f_Z$). The table 200 is stored in the memory 64 of the diagnostic apparatus 50 or host computer 66, so as to be easily accessible by the processor 90. The table 200 includes various health states of the pump shown generally at 202 which correspond to current amplitudes over the frequency range $f_0$ thru $f_N$. For example, referring to the row identified by reference numeral 204, when the vibration amplitudes are $A_{234}$ at $f_0$, $A_{27}$ at $f_1$, $A_{478}$ at $f_2$, $A_{24}$ at $f_3$, $A_{127}$ at $f_4$, . . . , $A_Q$ at $f_n$, the table 200 indicates that the pump 32 has a "pump fault 6". The "pump fault 6" could be a cavitation fault or a variety of other pump related faults. As will be appreciated the table 200 can store N number of current signatures corresponding to various health states of the pump 32, which the processor 90 can employ to diagnose the health of the pump 32.

Figure 7:
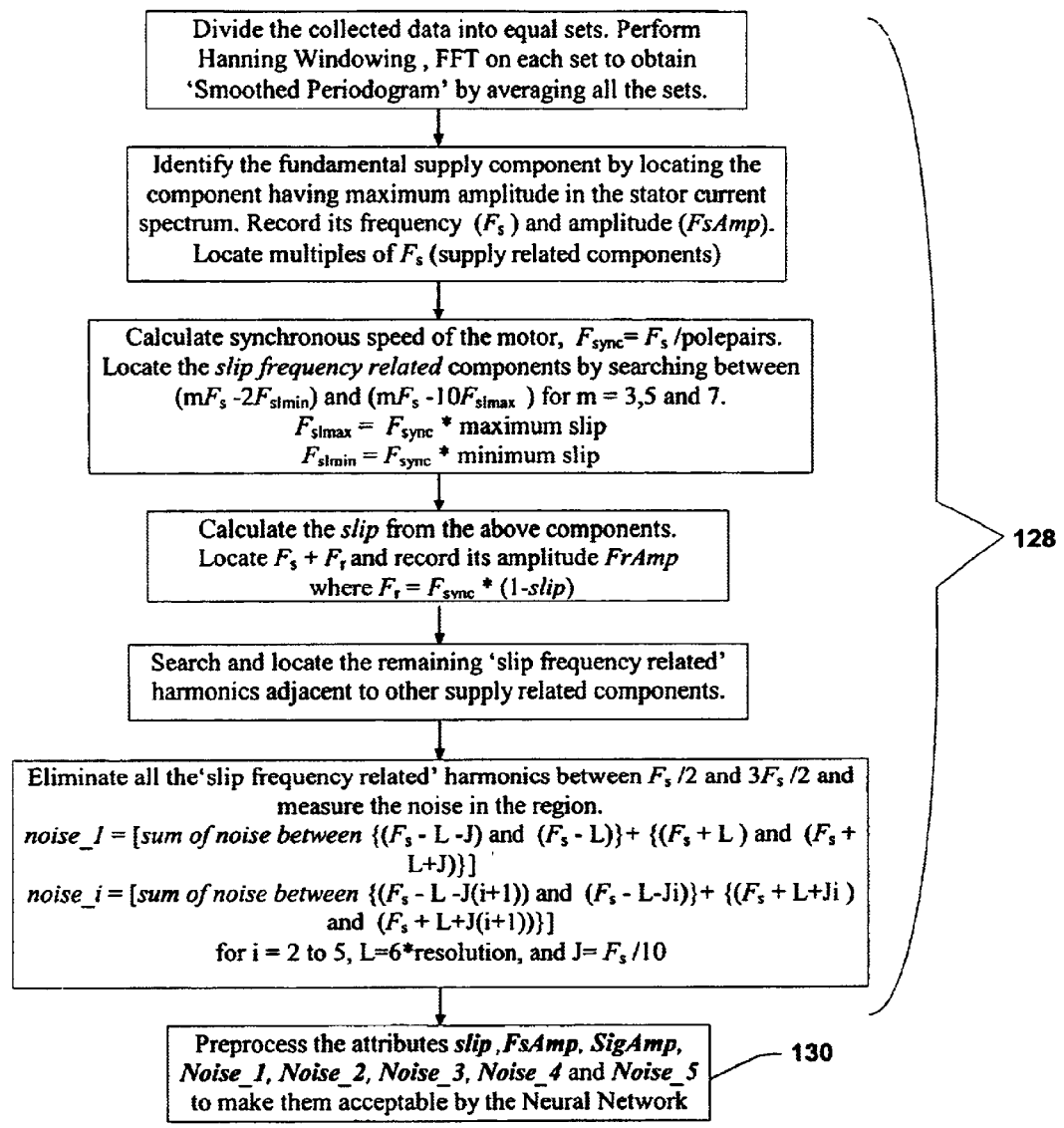
FIG. 7 is a flow diagram for creating a fault signature from the current spectrum on the conditioned signal received from the AC induction motor of FIGS. 1a–1c in accordance with the present invention.

Furthermore, it was found by evaluating the different fault conditions of the pump, certain discriminating fault attributes may be extracted from the frequency spectrum of motor current which relate certain fault conditions of the pump. Typical attributes such as motor slip and noise directly relate to degree of cavitation. An algorithm performed by processor 90 can be seen in FIG. 7, which evaluates the components of the frequency spectrum and derives certain atrtibutes for a centrifugal pump. The attributes shown in FIG. 7 are slip, FsAmp, SigAmp, Noise_1, Noise_2, Noise_3, Noise_4 and Noise_5, which form the fault signature for the centrifugal pump. For example, if FsAmp is low and slip is low there is fault condition of severe blockage. Other types of faults can be found, such as cavitation and faulty impeller by evaluating the above attributes. The attributes then must be subjected to the step of preprocessing 130 to be acceptable by the neural network 80.

In some cases it is necessary to preprocess the fault signature data before it is being used to train or design a decision module based on ANN paradigms. The preprocessing can be divided into three tasks, namely, elimination of outliers, scaling, and bifurcation of data into training and testing sets. Elimination of outliers is concerned with detecting any such data pattern that has one or more attributes which seem to have an extraordinarily large or small values compared to the allowed range for that attribute(s). Such data patterns are known as outliers which could be generated due to errors during data collection or fault signature formation or due to noise. Elimination of such data patterns facilitates proper utilization of the data set for designing the network. The adverse effects caused by not eliminating outliers are compression of the useful range of a given attribute during scaling and causing difficulties for the network in converging to a final solution.

The fault signature which is an array of real values is known as an analog data pattern, analog exemplar, or feature vector in the field of neural networks. Although, it is possible to take the attributes generated in the previous section and apply them directly as inputs to a neural network, it is practically more beneficial in terms of simplicity of the designed network and in terms of the computational load on the processor, to scale the attributes in such a way that each of the attributes has similar boundaries such as $\{0, 1\}$ or $\{-1, 1\}$. For example, in the pump condition monitoring data patterns, the slip attribute would have a value on the order of $10^{-2}$ while the FsAmp attribute can have values greater than $10^3$ and the possible range of their values can also differ greatly. Using such a data set directly, without scaling, in conjunction with a neural network would lead to large values of network parameters (e.g. weight vectors) and the time taken for completely training the network or designing the network would be high. The simplest and most widely used scaling method is the linear scaling method. Alternatively sigmoidal scaling can be used.

Returning to FIG. 4a, the processor 90 then transmits the fault signature to neural network 80 after step 130. Neural network 80 could be a multi-iterative, supervised learning algorithm such as feed forward, back propagation network. This network could be trained and used with a fully-labeled data set corresponding to all possible operating conditions. However, the application of unsupervised ANN techniques that could learn on-line (even in a single iteration) are preferred. Also, the ability to perform incremental learning such as provided in the proposed unsupervised neural network is preferred. Processor 90 can be programmed to perform the necessary post processing of the fault data in step 132 and provide that information to a user interface 134. It should be appreciated that the functions of diagnosing the motor current data containing pump fault information can be completely performed by the host computer 66.

Figure 4B:
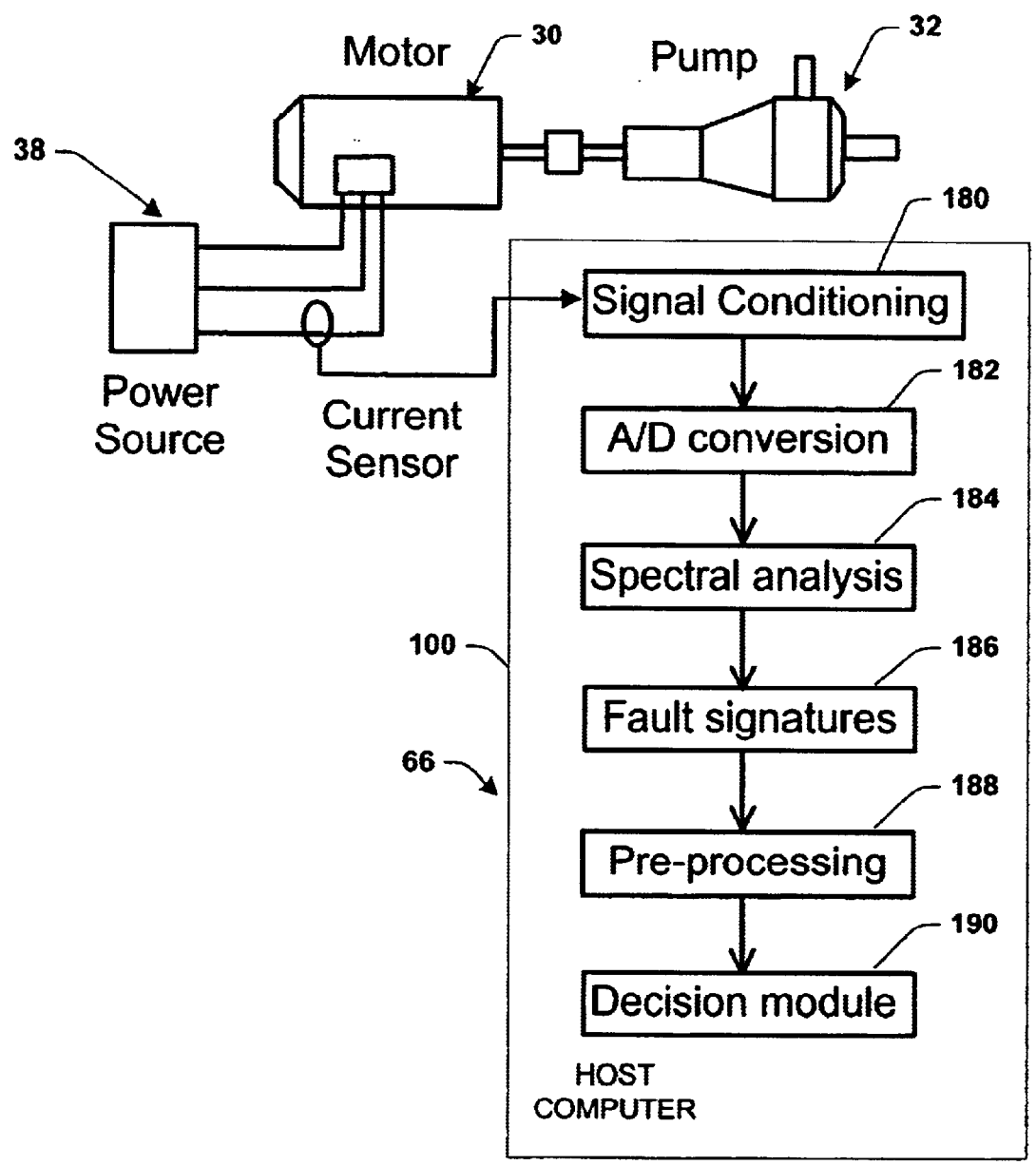
FIG. 4b is a function block diagram illustrating the monitoring system of the FIG. 4a integrated into a host computer in accordance with the present invention.

FIG. 4b illustrates an embodiment of the present invention wherein the host computer 66 performs the signal conditioning 180, A/D conversion 182, spectral analysis 184, formation of the fault signatures 186 and preprocessing 188. The host computer 66 may also include the decision module 190 which may be comprised of neural network 80 and post processing 132. Similarly, all these functions may be performed in embedded system 50 which may be integral with the motor.

Figure 8:
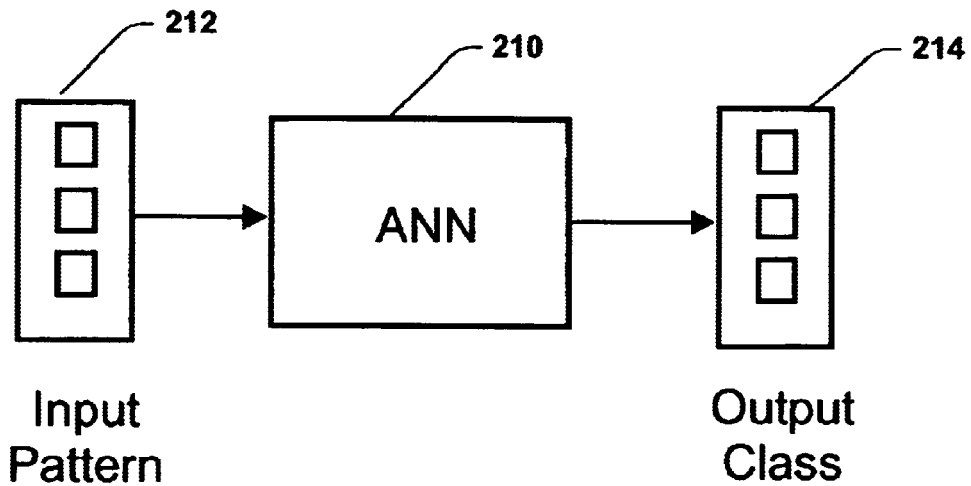
FIG. 8 is a block diagram of an artificial Neural Network in accordance with the present invention.

Neural network 80 or better known as an Artificial Neural Network (ANN) will now be discussed with regards to its implementation by the present invention. ANNs are a set of algorithms or processing steps that can be used to impart the capabilities such as generalization and pattern recognition to a standard computer system. These algorithms can learn to recognize patterns or classify data sets by two methods, known as supervised learning and unsupervised learning. Considering the block diagram shown in the FIG. 8, in which an ANN is represented by a 'square block' 210, the ANN is supervised if the network is provided with a set of input patterns 212 along with their designated outputs 214, and the network learns by changing its internal parameters in such a way that it produces the corresponding designated output pattern for a given input pattern. The ANN is known as unsupervised if the network chooses its own output class for a given input pattern without any external supervision or feed-back. The ANN structure basically contains processing nodes called neurons arranged in two or more layers. The nodes are extensively interconnected typically in a feed forward manner through connections and associated interconnection weights. For a pattern recognition application, the input pattern could be a digitized image of an object to be recognized and the output could be the same image (e.g., with reduced noise), or it could be a class representation of the image. For a condition monitoring application such as the one for pumps, the input pattern is preprocessed fault signature data derived from the stator current spectra, and the output is a class representation of various fault conditions. There are various architectures and learning schemes for the ANNs and some of the ANNs are more suitable for use as decision makers for condition monitoring applications than others.

Figure 9:
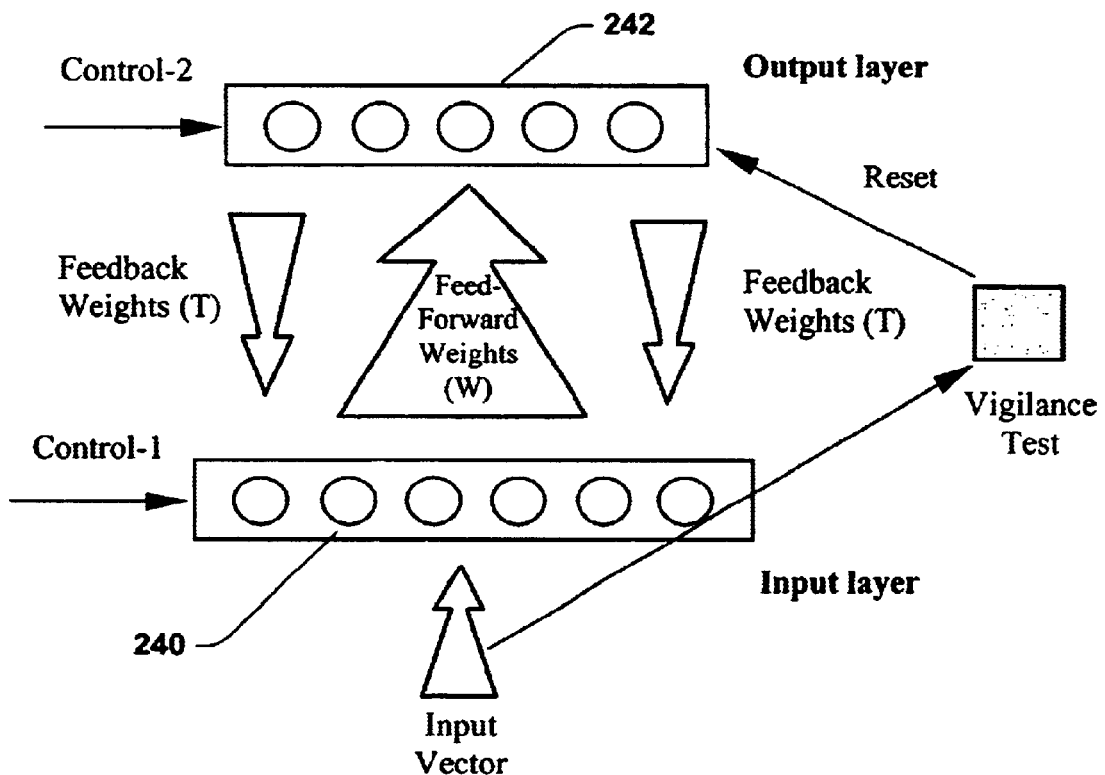
FIG. 9 is a block diagram of an artificial neural network in accordance with the present invention utilizing an Adaptive Resonance Theory paradigm.

It has been found that one-shot unsupervised ANN paradigms are more suitable for the development of condition monitoring system than supervised ANN paradigms. Furthermore, a monitoring system based on an unsupervised neural network that can learn about the conditions of a process plant from a single pass of the training data, can provide a better solution for detecting new plant conditions. Supervised networks must be trained off line, and thus have a fixed set of variables and cannot give a valid output upon receipt of a new condition. A block diagram of a one such one-shot unsupervised ANN network known as the Adaptive Resonance Theory (ART) is shown in FIG. 9.

Figure 10:
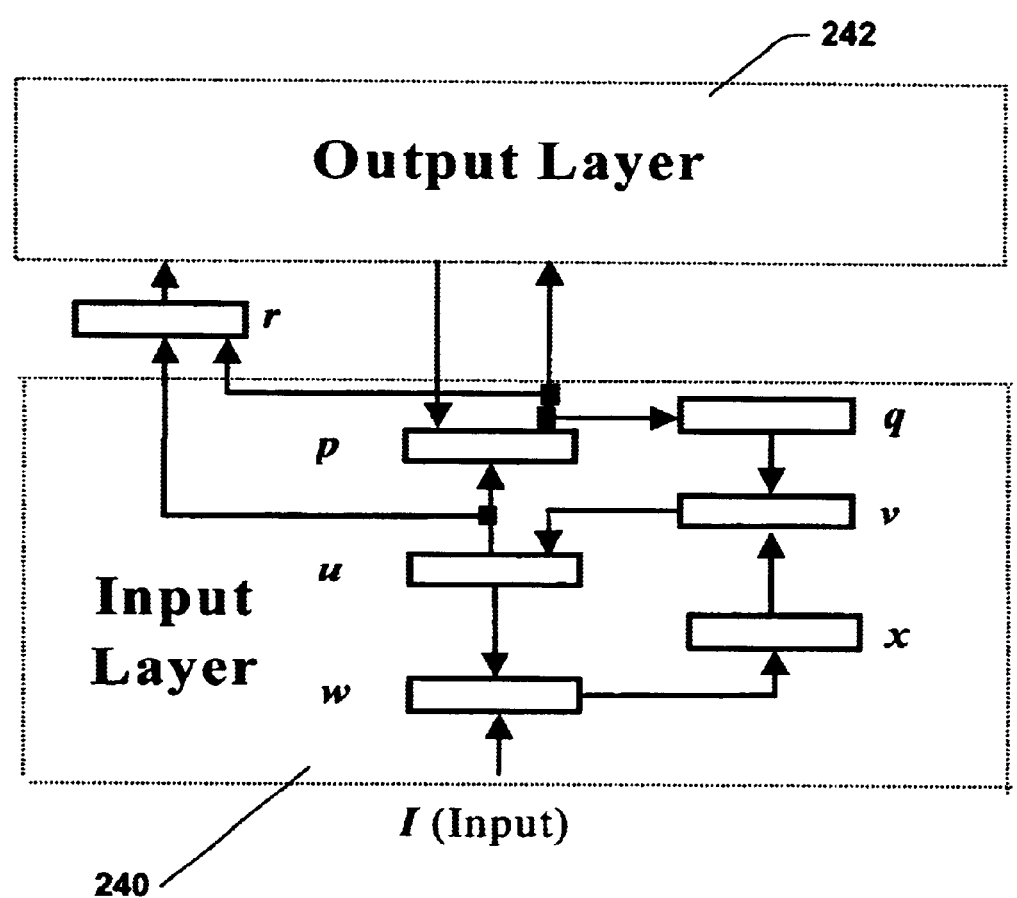
FIG. 10 is a block diagram of an Artificial neural network in accordance with the present invention utilizing the second version of the Adaptive Resonance Theory paradigm.

ART has two layers namely the input (or comparison) layer 240 and output (or recognition) layer 242. These layers are connected together, unlike the other networks discussed above, with feedforward (denoted by W) as well as feedback (denoted by T) connections. The neurons of the output layer also have mutual connections useful for lateral inhibition (not shown in the Figure). The signals Control-1 and Control-2 are responsible for controlling the data flow through the input and output layers, 240 and 242, respectively. The reset circuit is responsible for determining the effectiveness with which a winning output neuron represents the input pattern. It is also responsible for resetting the ineffective neurons and designating a new neuron for representing a given input pattern. The training of the ART network can be done in either a fast learning mode or in a slow learning mode. The fast learning mode allows the network's feed forward weights to attain their optimum values within few learning cycles (epochs) while the slow learning mode forces the weights to adapt over many epochs. The fast learning mode can be used to train the network even in a single epoch. This is appropriate for the present case because the salient features of the problem domain are already well defined in the fault signatures. FIG. 10 illustrates the ART-2 architecture, which is essentially the same as the ART architecture except that the input layer of ART-2 has six sublayers (w,x,v,u,p and q) which are designed to enhance the performance of the network to cope with the continuously varying real input data. The additional sublayers incorporate the effects of feature enhancement, noise suppression, sparse coding and expectation from the recognition layer. The reset function is incorporated by an additional sublayer (r) containing the same number of nodes as the sublayers of the input layer.

Another useful unsupervised ANN algorithm applicable to the present invention is the Associative List Memory (ALM) paradigm. Associative List Memory (ALM) is an autoassociative memory capable of handling long bit strings (up to $10^4$ bits) of data. ALM's learning mechanism is based on unsupervised training technique and can learn within a single epoch. It has been successfully applied to reduce and classify the data produced by satellites and the results have shown that ALM is comparable or better than other associative memories such as the Sparse Distributed Memory for this application. It provides direct access to the learned exemplars and can be implemented on a low-cost computing platform (e.g., a 16 bit microprocessor). With suitable modifications ALM can be used for classifying analogue inputs (e.g. pump fault signature data). Its one-shot learning capability, simple algorithm structure, and incremental learning capability make it a suitable choice for implementing a stand-alone decision module for pump diagnostics.

In a typical commercial or industrial pumping system, it will not be possible to generate a dataset containing all possible operating conditions or faults. Simple linear scaling of the available data cannot ensure that any future data, which might occur due to a new plant operating condition, would lie within the same initial limits. Hence an adaptive preprocessing scheme is employed which adaptively updates the maximum and minimum values of each attribute so that the entire data base is maintained to have values between 0 and 1. This increases the computational task, but the potential advantages of the generic condition monitoring scheme out-weigh this minor drawback. Output generated by an unsupervised neural network needs to be post processed in order to obtain useful classification information. In the classification applications using the unsupervised ANN paradigms, usually the domain expert (a human expert, having knowledge about the problem) examines the output classes assigned by the ANN in conjunction with system details such as which of the input patterns has activated which of the output entries, the class to which a given input actually belongs etc., and then assigns the class representation to each of the output entries. The above procedure is suitable for applications such as classification of satellite pictures etc., but is not suitable for on-line condition monitoring applications.

Without the above mentioned post processing, an unsupervised ANN based decision module for the condition monitoring applications, can only signal the formation of a new output entry indicating that a possible new plant condition has occurred, but it cannot diagnose the new condition to be a particular case, such as a new normal condition, cavitation etc. It is, however, possible that an intelligent post processor based on expert system rules, can be used to assign the class representation to each of the output entries formed by the unsupervised neural networks such as ART and ALM. The attributes of the fault signatures obtained from the stator current of the motor are derived based on the physical interpretation of the functioning of the pumps and pumping systems. This means that the variation of each of the attributes are associated with the physical status of the pump. Thus, it is possible to correlate the attribute representing the pump condition with rules such as 'IF attribute-1 is high and attribute-2 is high THEN the pump condition is cavitation' etc. An expert system based on such generic rules can be used to assign the class representation to the output entries formed by the unsupervised ANN paradigm so that the decision module produces a meaningful output without any external human supervision.

Figure 11:
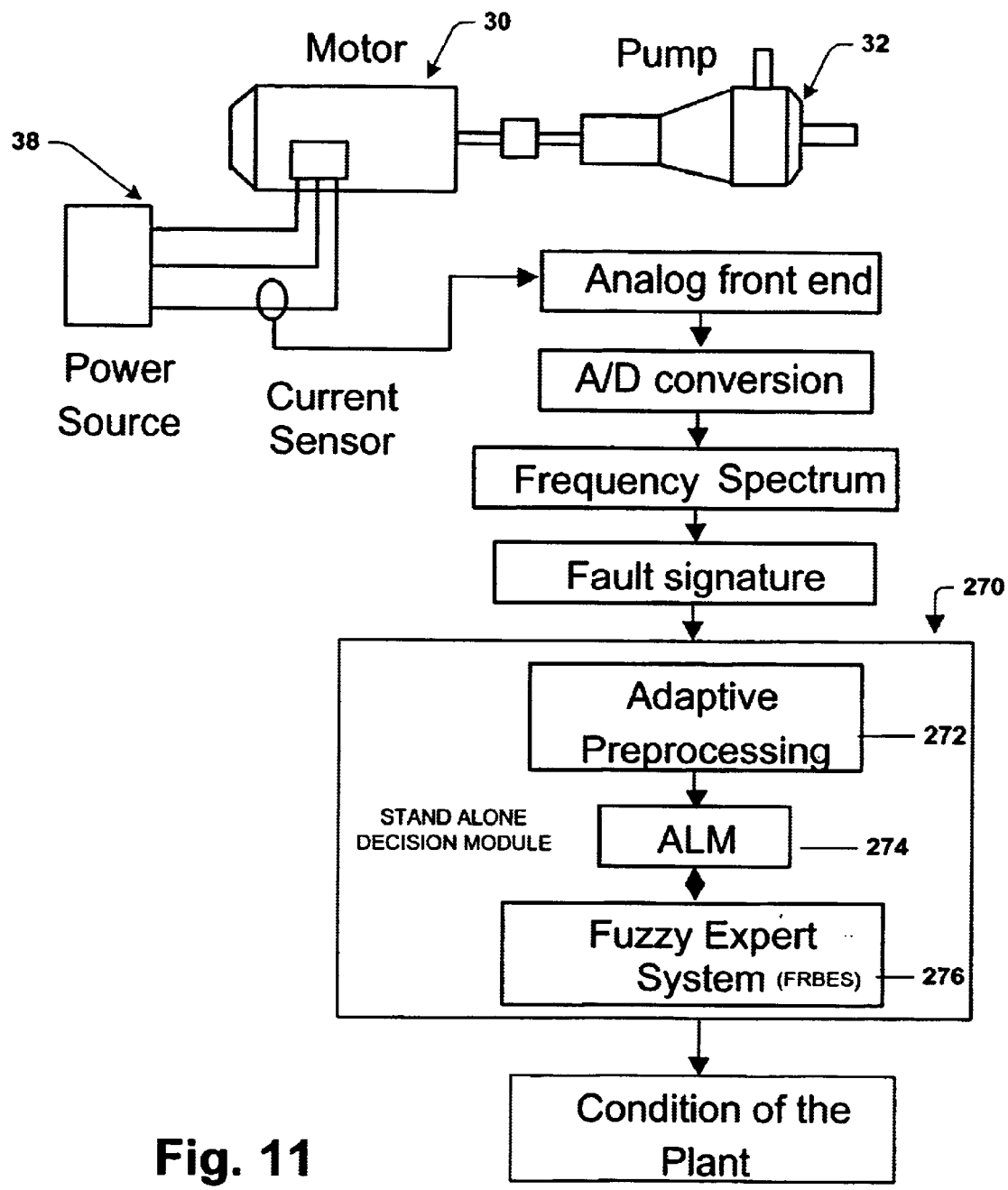
FIG. 11 is a functional schematic diagram of the monitoring system of FIG. 4a including a stand alone decision module adapted for pump diagnosis in accordance with the present invention.
Figure 12:
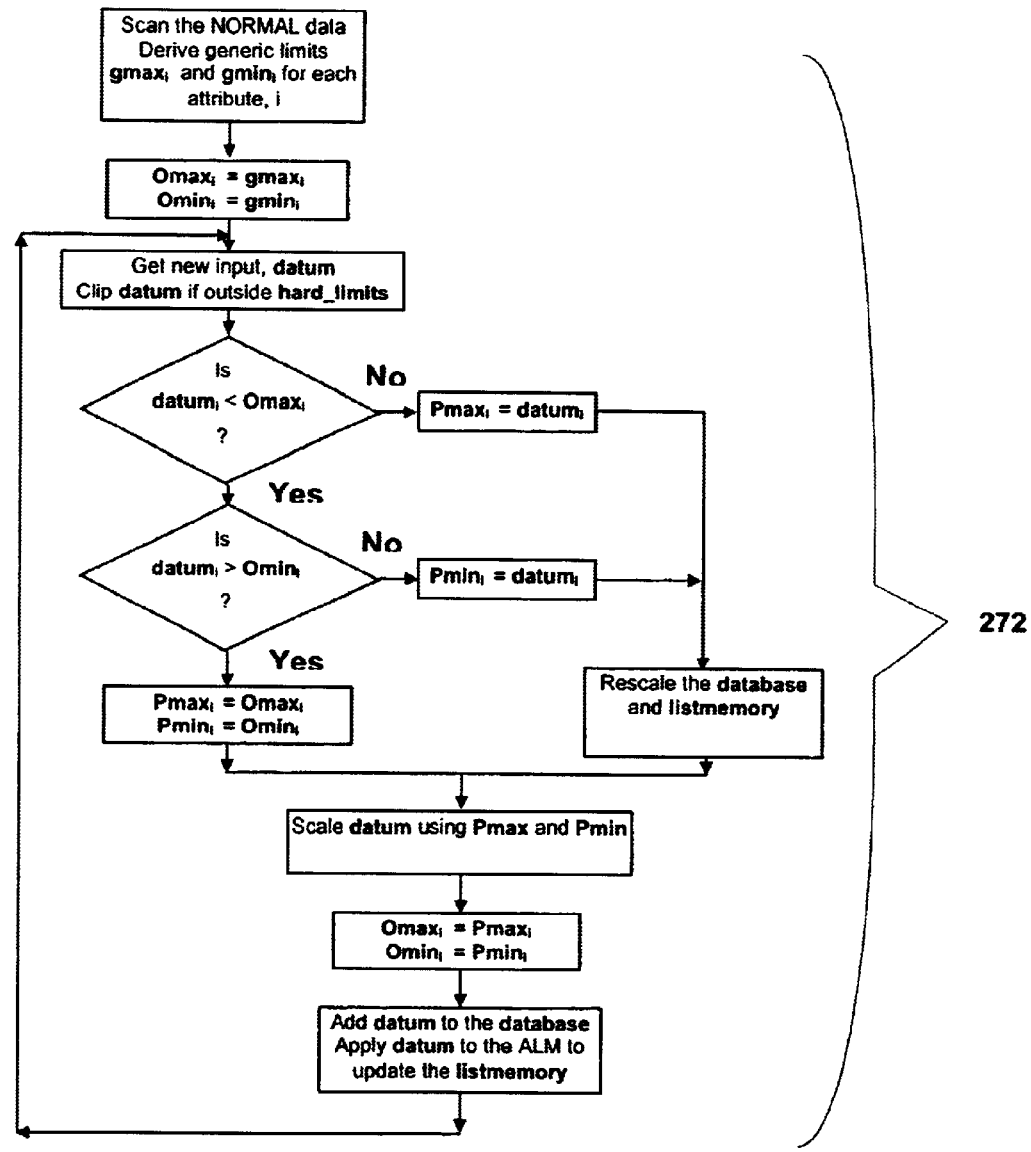
FIG. 12 is a flow diagram for performing an adaptive preprocessing step for the stand alone decision module of FIG. 11 in accordance with the present invention.

Referring to FIG. 11, a condition monitoring system is provided that utilizes a stand alone decision module. The stand alone decision module includes hardware and/or software that performs an adaptive preprocessing step, an ALM neural network and software that utilizes a Fuzzy Expert System in a post processing step. To exploit the potential advantages of one-shot methods as decision modules for the on-line condition monitoring schemes, a flexible preprocessing method is employed which adaptively preprocesses the incoming data to bound its attribute values to the predefined limits of 0 to 1, by using pre-specified maximum and minimum limits, which can be easily defined by the domain expert, who has knowledge of the equipment (type of motor, pump etc.) and the plant (flow rate, differential pressure head etc.). Where attribute values are not predictable, limits are set based on observation of the range encountered during measurement. These initial limits act as maximum and minimum boundaries for calculating scaling factors to preprocess the incoming data as long as the incoming data patterns fall within range. When any of the attributes of the incoming data patterns has a value beyond these limits then the maximum and minimum boundaries are expanded to include the present pattern and new scaling factors are obtained. Whenever such a change of maxima or minima boundaries occurs, the neural network paradigm that using the preprocessed data has to be updated to account for the new changes in the scaling factors and also the previously accumulated data base may need to be rescaled using the new scaling factors based on how much the new boundaries have expanded. In the case of the ART-2 algorithm, the feed-forward and feed-back weight vectors are rescaled to account for the new changes, and for an ALM the memory entries themselves rescaled. Although the proposed adaptive preprocessing scheme will work without defining any maximum and minimum limits beforehand, it is faster and more efficient to specify and utilize initial expected limits. It should be appreciated that the present invention could employ operator input training techniques. FIG. 12 illustrates a flow-chart of the functional description of the adaptive preprocessing scheme 272. The expected maxima and minima for each attribute are first derived by analyzing the normal condition data and the other relevant pump/plant details, ratings and physical system. It should be noted that in some circumstances it may not be necessary to employ preprocessing and postprocessing techniques.

Figure 13:
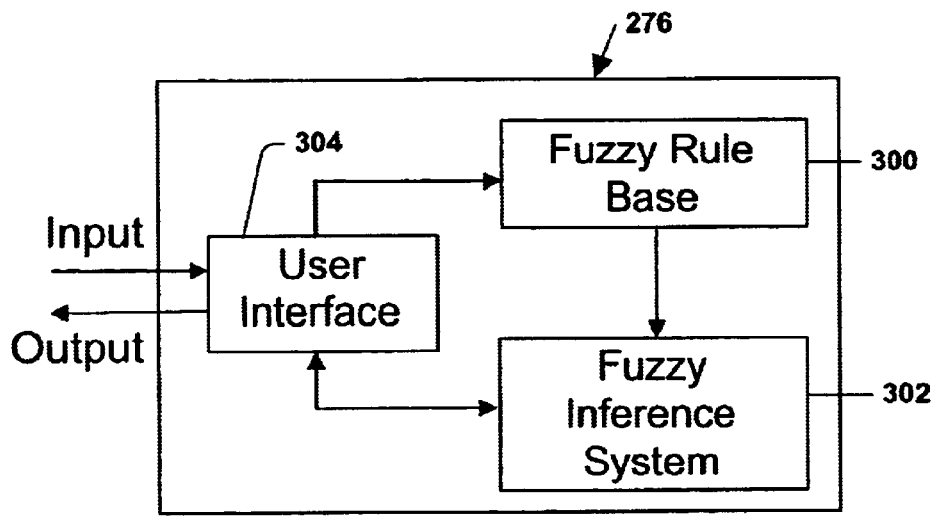
FIG. 13 is a schematic representation of the Fuzzy Rule Base Expert System in accordance with the present invention.

A block diagram of a Fuzzy Rule Based Expert System (FRBES) 276 is shown in FIG. 13. It consists of three modules namely, a Fuzzy Rule Base 300, a Fuzzy Inference Engine 302 and a User Interface 304. The Fuzzy Rule Base 300 consists of Fuzzy type 'IF-THEN' rules, while the Fuzzy Inference Engine 302 is the core logic program which includes details of the Fuzzy system such as the number and types of membership functions of inputs and outputs, their range, method of defuzzification, etc. The User Interface 304, in a production-level expert system is capable of querying the user for additional information in case the expert system is unable to reach a conclusion with the existing information in its data base.

Figure 14:
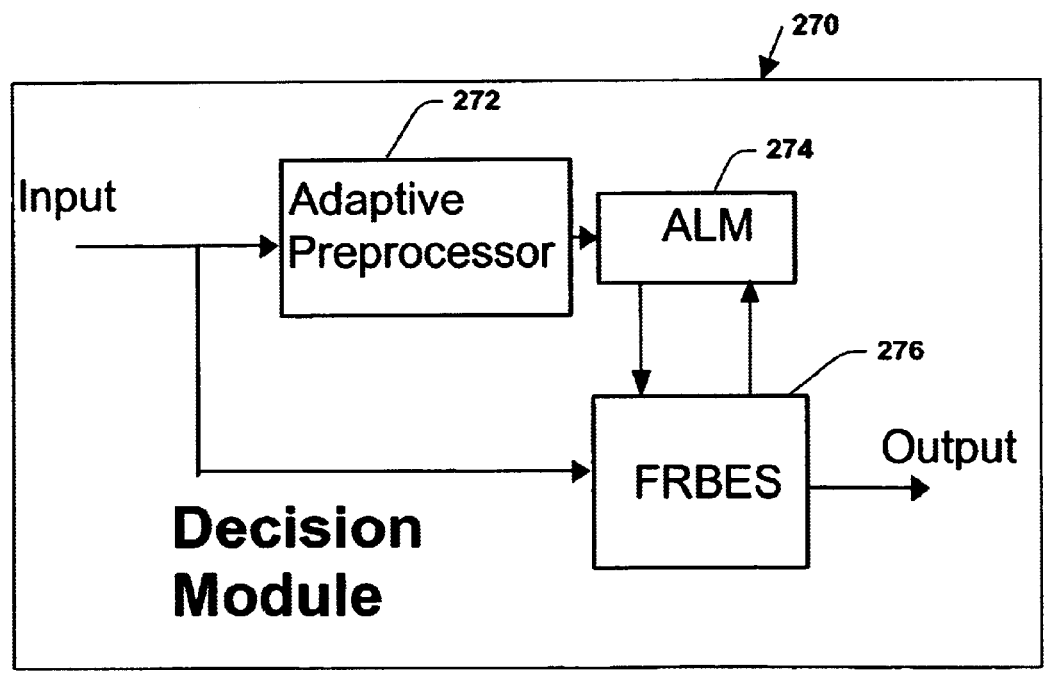
FIG. 14 is a schematic representation of the stand alone decision module in accordance with the present invention.

As can be seen in FIG. 14, the decision module 270 can be integrated as a stand alone decision module where the input can be received both by the Adaptive Preprocessor 272 and the FRBES 276. Bidirectional communication is set up between the ALM Neural Net 274 and the FRBES 276. The ALM may receive new classification information which may be entered from the user interface portion of the FRBES. The ALM Neural Net 274 then generates the appropriate output pattern to a user interface. The rule base of the FRBES in the present example comprises fifteen generic rules formed on the basis of the generic knowledge about the behaviour of the attributes with respect to a given plant condition. These rules are listed in FIG. 15. The MATLAB source code corresponding to the FRBES described above can be implemented using MATLAB's Fuzzy Logic Tool-Box. It should be appreciated that the Adaptive Preprocessor 272, ALM paradigm 274, and the FRBES 276 could be implemented in stand alone hardware modules or in a single integrated hardware module. Furthermore, separate processors and software programs could be used or a single processor and software program could be used to run the Adaptive preprocessing and FRBES steps. It should be appreciated that the stand alone decision module can be used to diagnose the operating condition of the pump system (e.g., cavitation), the health or condition of the pump (e.g., impeller damage), and also the condition of the motor driving the pump (e.g., rotor bar damage).

Figure 16:
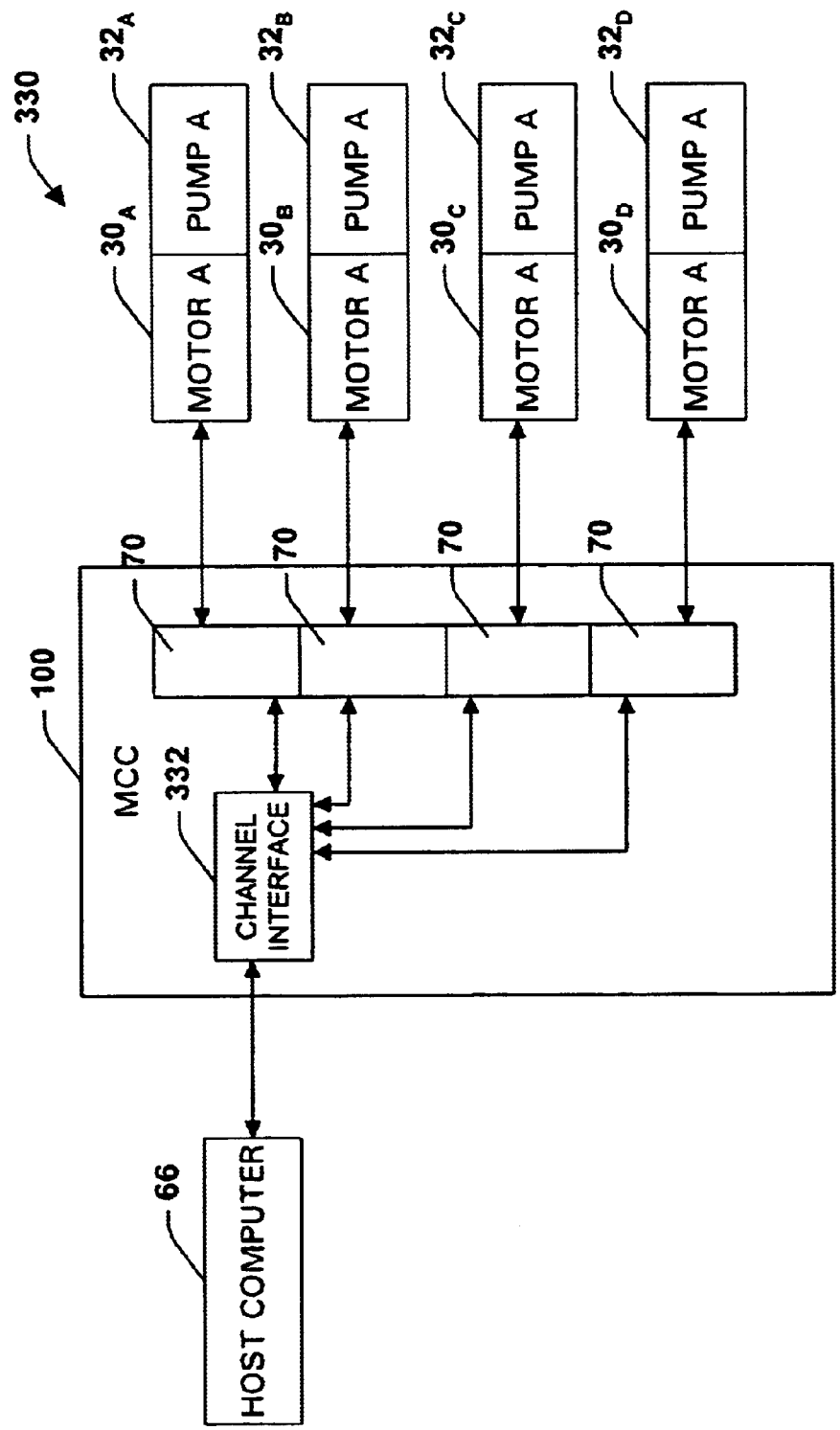
FIG. 16 is a schematic representation of a system for monitoring a plurality of pumps in accordance with the present invention.

Turning now to FIG. 16, the host computer 66 is shown as part of a system 330 where the host computer 66 performs classical current signature analysis on a plurality of motors $30_A$–$30_D$. The motors $30_A$–$30_D$ drive pumps $32_A$–$32_D$. Although only four motors and four pumps are shown as part of the system 330, it will be appreciated that virtually any number of motors and pumps may be employed in this system 330. The motors $30_{A-30D}$ are each individually tied to the motor control center 100. As mentioned above, the MCC 100 is often used with industrial electric motors to start, control and protect the electric motors and their associated electric circuitry. The motor control center 100 contains motor starters to start and stop the motors along with circuit breakers to protect the electric motors and electric wiring. The motor current sensors 70 are enclosed within the MCC 100. Each respective motor $30_A$–$30_D$ has current sensor(s) coupled to its respective lead wire(s) to obtain current signal data. The digitized current signal data 120 for each motor $30_A$–$30_D$ is applied to a channel interface 332. The channel interface 332 includes a separate channel for each motor of the system 330. The channel interface 332 is coupled to the host computer 66.

The host computer 66 cycles through each channel at predetermined intervals to obtain current data with respect to each motor $30_A$–$30_D$. The host computer 66 then essentially carries out the same steps as described above with reference to FIG. 4b as to performing classical fault signature analysis to determine the operating condition of the pumps $32_A$–$32_D$. The advantage of this system 330 is that it allows for the analyzing a plurality of pumps by a single computer 66. In this way, a user of the host computer 66 could monitor and analyze every motor or machine within a facility from a single location.

It will also be appreciated that the host computer 66 may be located at a remote facility far away from the motors $30_A$–$30_D$ with suitable drivers and protocols. For example, a manufacturer of motors located in the United States could analyze motors located in a plant in China via the above system 330. The host computer 66 being located in the United States could be linked to the channel interface 330 of the MCC 100 via a suitable digital communication link. The manufacturer having access at his/her end to vast amounts of historical data relating to the particular pumps $32_A$–$32_D$ could quickly perform a diagnosis of the state of the pumps using the fault signature data. The manufacturer now knowing what is probably wrong with the pumps and what is involved with fixing the pumps could then take appropriate measures (e.g., sending a pump expert to the Chinese facility) to correct the motor problems or directing the shipment and replacement of degraded pump parts for example. It should be appreciated that the system can also monitor the operating condition of the motors $30_A$–$30_D$ driving the pumps $32_A$–$32_D$ simultaneously with the monitoring of the pumps.

Although the present invention has been described with respect to obtaining Fast Fourier Transforms of the current signals, it should be appreciated that other suitable techniques may be employed. For example, wavelet transforms may be derived from the current data.

Wavelets have a variety of applications, for example, wavelets have been used in signal analysis, as discussed in Mallat, "A theory for Multiresolution Signal Decomposition: The Wavelet Representation," IEEE transactions on Pattern Analysis and Machine Intelligence 11(7):674–693, July 1989. Wavelets have also been used in image processing and numerical analysis, as discussed in DeVore, Jawerth, and Lucier, "Image Compression Through Wavelet Transform Coding," IEEE Transactions on Information Theory 38(2):719–746, March 1992 and Beylkin, Coifman and Rokhlin, "Fast Wavelet Transforms and Numerical Algorithm I," Communications on Pure and Applied Mathematics 44:141–183, 1991, respectively. All of these references are hereby incorporated by reference in their entirety.

FIG. 17 shows replacing the step 126 (FIG. 4a) of computing the Fast Fourier Transformation of digital conditioned signal 120 with computing the wavelet of the conditioned signal 120. All that is required for performing a wavelet transform is an appropriate set of analysis and synthesis filters. By using the wavelet transform with the neural network 80, a much smaller, compact, training set may be employed, which still enables the present invention to correctly classify the operating state of the motor pump system. Furthermore, original signal information from the wavelet coefficients as may be needed in the future. This approach also affords for a pseudo frequency domain and time domain analysis of the signal data. Such a combination involves relative simplicity of implementation while affording great flexibility in accommodating a broad range of signal types and noise levels.

It should be appreciated that the present invention employs techniques that show direct application to machinery diagnosis using a variety of techniques, algorithms and models. These techniques could be readily expanded to include pump hardware and pump process protection via automatic shutdown, failure prediction/prognostics, corrective action recommendations, monitor and control energy usage and to ensure EPA and safety guidelines are complied with using monitoring and archival data storage. It should also be appreciated that the techniques provided in the present invention could be applicable to a broad range of pumps (e.g., centrifugal, positive displacement, compressors, vacuum pumps, etc.).

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for monitoring the condition of a pump driven by a motor, comprising:
   a sensor electrically coupleable to a power lead of the motor, the sensor adapted to obtain and monitor at least one current signal relating to the operation of the pump; and
   an artificial neural network coupleable to the sensor, the artificial neural network being adapted to detect at least one fault relating to the operation of the pump from the at least one current signal.

2. The system of claim 1, wherein the sensor is a current transformer.

3. The system of claim 1, wherein the artificial neural network is an unsupervised neural network.

4. The system of claim 3, wherein the unsupervised neural network is a one-shot unsupervised neural network.

5. The system of claim 1, further including a processor coupleable to the sensor, the processor adapted to generate fast fourier transforms of the at least one current signal.

6. The system of claim 5, wherein the processor is adapted to create a fault signature from a current spectrum created from the fast fourier transformation of the at least one current signal wherein the fault signature contains distinguishable attributes relating to diagnosis of faults of the pump.

7. The system of claim 1, wherein the processor is adapted to preprocess the fault signature by eliminating outlayers, and performing scaling and bifurcation of the fault signature data set.

8. The system of claim 1, wherein the artificial neural network is also adapted to detect at least one fault relating to the operation of the motor from the at least one current signal.

9. The method of claim 1, wherein the artificial neural network is also adapted to detect at least one fault relating to the operation of the motor from the at least one current signal.

10. A method for monitoring the condition of a pump driven by a motor, comprising the steps of:
    collecting and monitoring a first sample of current data signal relating to the operation of the pump;
    inputting the first sample of current data signal to a neural network,
    collecting and monitoring a second sample of current data signal relating to the operation of the pump; and
    inputting the second sample of current data signal to the neural network, wherein any differences between the first signal and the second signal will be generated as a change in condition signal by the neural network, any change of condition signal representing a pump fault condition.

11. The method of claim 10, wherein the step of collecting at least one sample of current data signal relating to the operation of the machine is accomplished by employing a current transformer.

12. The method of claim 10, wherein the artificial neural network is an unsupervised neural network.

13. The method of claim 10, wherein the unsupervised neural network is a one-shot unsupervised neural network.

14. The method of claim 10, wherein the first sample of current data is a training sample for training the neural network.

15. The method of claim 10, wherein the first and the second sample of current data is transformed to a frequency spectrum by fast fourier transformation.

16. The method of claim 15, wherein the frequency spectrum is transformed to a fault signature and the fault signature is preprocessed by eliminating outlayers, and performing scaling and bifurcation of the fault signature before being fed to the neural network.

17. The method of claim 16, wherein output of the neural network is post processed to determine the specific fault condition represented by a change of condition signal.

18. The method of claim 17, wherein the step of post processing includes comparing the specific fault condition to fault attributes found in a fault signature of the pump.

19. A stand alone decision module adapted to receive a current signal from a machine and facilitate diagnosing the state of the machine by determining if the current signal contains fault data relating to the state of the machine, the decision module comprising:
    a neural network coupleable to a sensor, the neural network adapted to synthesize a change in condition signal from the sampled current data;
    a preprocessing portion coupled to the neural network, the preprocessing portion adapted to condition the current signal prior to inputting the current signal into the neural network; and
    a post processing portion coupled to the neural network, the post processing portion adapted to determine whether the change in condition signal is due to a fault condition related to the state of the machine.

20. The module of claim 19, wherein the artificial neural network is an unsupervised neural network.

21. The module of claim 20, wherein the unsupervised neural network is a one-shot unsupervised neural network.

22. The module of claim 21, wherein the paradigm of the neural network is of the type ART2 (Adaptive Resonance Theory).

23. The module of claim 21, wherein the paradigm of the neural network is Associative List Memory.

24. The module of claim 19, wherein the post processing portion is a fuzzy rule based expert system.

25. The module of claim 19, wherein the module is adapted to detect at least one fault relating to the operation of a pump driven by the machine and at least one fault relating to the operation of the machine driving the pump from the current signal generated by the machine.

26. A system for simultaneously monitoring the condition of a pump driven by a motor and the condition of the motor driving the pump, comprising:
    a sensor electrically coupleable to a power lead of the motor, the sensor adapted to obtain and monitor at least one current signal relating to the operation of the pump and the operation of the motor; and
    an artificial neural network coupleable to the sensor, the artificial neural network being adapted to detect at least one fault relating to the operation of the pump and at least one fault relating to the operation of the motor from the at least, one current signal.

27. The system of claim 26, wherein the artificial neural network is an unsupervised neural network.

28. The system of claim 27, wherein the unsupervised neural network is a one-shot unsupervised neural network.

29. The system of claim 28, wherein the paradigm of the neural network is Adaptive Resonance Theory.

30. The system of claim 28, wherein the paradigm of the neural network is Associative List Memory.

31. The system of claim 26, farther including a processor coupleable to the sensor, the processor adapted to generate fast fourier transforms of the at least one current signal.

32. A system for diagnosing a plurality of pumps, each driven by a motor, comprising:
- a plurality of electrically coupleable sensors for obtaining and monitoring current data signals from each motor;
- a channel interface coupleable to the plurality of sensors, the channel interface designating a separate channel for each of the plurality of sensors; and
- a host computer coupleable to the channel interface, the host computer including a neural network coupleable to each channel of the channel interface, the neural network adapted to detect at least one fault relating to the operation of the plurality of pumps from the current data signals, wherein a processor of the host computer cycles through each of the channels, the processor performing classical signature analysis on each of the plurality of pumps using the current data signal for each respective pump.

33. A system for monitoring the condition of a pump driven by a motor, comprising:
- electrically coupleable sensor means for detecting at least one current signal from the motor, said at least one current signal containing fault attributes related to the condition of the pump;
- extraction means for extracting the fault attributes from the at least one current signal;
- processing means for determining if the fault attributes signify a fault condition of the pump; and
- means for communicating any fault conditions to a system operator.

34. The system of claim 33, wherein said processing means includes an unsupervised neural network.

35. The system of claim 34, wherein the unsupervised neural network is a one-shot unsupervised neural network.

36. A system for monitoring the condition of a pump driven by a motor, comprising:
- a sensor electrically coupleable to a power lead of the motor, the sensor adapted to obtain and monitor at least one current signal relating to the operation of the pump;
- a processor couple able to the sensor, the processor adapted to convert the at least one current signal to a frequency spectrum having a plurality of fault attributes related to the condition of the pump and preprocess the fault attributes;
- an unsupervised artificial neural network coupleable to the processor, the artificial neural network being adapted to recognize and detect any changes in the plurality of preprocessed fault attributes and provide a change of condition pattern relating to any changes in the plurality of preprocessed fault attributes; and
- a post processor including decision making rules for determining fault conditions of the pump based on the change of condition pattern, the post processor communicating any fault conditions to a system operator.

37. The system of claim 36, wherein the unsupervised neural network is a one-shot unsupervised neural network.

38. The system of claim 36, wherein the paradigm of the neural network is Adaptive Resonance Theory.

39. The system of claim 36, wherein the paradigm of the neural network is Associative List Memory.

40. The system of claim 36, wherein the post processor is a fuzzy rule based expert system.

41. The system of claim 36, wherein the system is adapted to detect at least one fault relating to the operation of a pump driven by the machine and at least one fault relating to the operation of the machine driving the pump from the current signal generated by the machine.

* * * * *